(12) United States Patent
Kurokawa et al.

(10) Patent No.: US 10,892,350 B2
(45) Date of Patent: Jan. 12, 2021

(54) SEMICONDUCTOR DEVICE

(71) Applicant: Murata Manufacturing Co., Ltd., Kyoto (JP)

(72) Inventors: Atsushi Kurokawa, Kyoto (JP); Yuichi Sano, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 16/268,557

(22) Filed: Feb. 6, 2019

(65) Prior Publication Data

US 2019/0267479 A1 Aug. 29, 2019

(30) Foreign Application Priority Data

Feb. 27, 2018 (JP) ................. 2018-033813

(51) Int. Cl.
*H01L 29/737* (2006.01)
*H01L 27/082* (2006.01)
*H01L 29/417* (2006.01)
*H01L 29/08* (2006.01)
(Continued)

(52) U.S. Cl.
CPC ........ *H01L 29/7371* (2013.01); *H01L 25/072* (2013.01); *H01L 27/0823* (2013.01); *H01L 29/0813* (2013.01); *H01L 29/0817* (2013.01); *H01L 29/41708* (2013.01); *H01L 29/66242* (2013.01); *H01L 29/66318* (2013.01); *H01L 29/737* (2013.01); *H01L 2224/02331* (2013.01);
(Continued)

(58) Field of Classification Search
CPC ........... H01L 29/66242; H01L 29/7371; H01L 29/66318; H01L 29/0817; H01L 29/0813; H01L 29/41708; H01L 2924/13051; H01L 25/072; H01L 27/0823; H01L 2224/02331; H01L 2224/02381; H01L 29/737

See application file for complete search history.

(56) References Cited

U.S. PATENT DOCUMENTS

| | | | |
|---|---|---|---|
| 10,361,666 B2 * | 7/2019 | Obu | ................ H01L 21/02271 |
| 2006/0197191 A1 * | 9/2006 | Tsai | .................... H01L 23/3114 |
| | | | 257/640 |
| 2012/0193799 A1 | 8/2012 | Sakuma et al. | |

(Continued)

FOREIGN PATENT DOCUMENTS

| JP | 2011-61183 A | 3/2011 |
|---|---|---|
| JP | 2016-103540 A | 6/2016 |
| WO | 2015/104967 A1 | 7/2015 |

*Primary Examiner* — Joseph C. Nicely
(74) *Attorney, Agent, or Firm* — Peame & Gordon LLP

(57) ABSTRACT

A semiconductor device includes a semiconductor element including a bipolar transistor disposed on a compound semiconductor substrate, a collector electrode, a base electrode, and an emitter electrode, the bipolar transistor including a collector layer, a base layer, and an emitter layer, the collector electrode being in contact with the collector layer, the base electrode being in contact with the base layer, the emitter electrode being in contact with the emitter layer; a protective layer disposed on one surface of the semiconductor element; an emitter redistribution layer electrically connected to the emitter electrode via a contact hole in the protective layer; and a stress-relieving layer disposed between the emitter redistribution layer and the emitter layer in a direction perpendicular to a surface of the compound semiconductor substrate.

20 Claims, 16 Drawing Sheets

(51) Int. Cl.
    *H01L 25/07*      (2006.01)
    *H01L 29/66*      (2006.01)
(52) U.S. Cl.
    CPC .............. *H01L 2224/02381* (2013.01); *H01L 2924/13051* (2013.01)

(56) References Cited

U.S. PATENT DOCUMENTS

2016/0315060 A1\* 10/2016 Umemoto ............... H01L 24/05
2018/0006144 A1   1/2018 Sasaki et al.
2018/0233475 A1   8/2018 Umemoto et al.
2019/0006410 A1\* 1/2019 Takahashi ............. H01L 21/285
2020/0168726 A1\* 5/2020 Kurokawa ........ H01L 29/41708

\* cited by examiner

SEMICONDUCTOR DEVICE

This application claims priority from Japanese Patent Application No. JP2018-033813 filed on Feb. 27, 2018. The content of this application is incorporated herein by reference in its entirety.

BACKGROUND OF THE DISCLOSURE

1. Field of the Disclosure

The present disclosure relates to semiconductor devices.

2. Description of the Related Art

Heterojunction bipolar transistors are known as transistors that constitute power amplifier modules such as those for portable terminals. A semiconductor device disclosed in International Publication No. 2015/104967 includes a redistribution line connecting an emitter electrode of a semiconductor element to a pillar bump.

If a redistribution line such as one formed of copper is disposed over an emitter electrode, the difference in thermal expansion coefficient between the redistribution line and a semiconductor layer such as an emitter layer would result in a thermal stress on the emitter layer or other layer. This thermal stress may degrade, for example, the transistor characteristics, thus decreasing the reliability of the semiconductor device.

BRIEF SUMMARY OF THE DISCLOSURE

Accordingly, it is an object of the present disclosure to provide a semiconductor device with reduced thermal stress.

According to preferred embodiments of the present invention, there is provided a semiconductor device including a semiconductor element including a bipolar transistor disposed on a compound semiconductor substrate, a collector electrode, a base electrode, and an emitter electrode, the bipolar transistor including a collector layer, a base layer, and an emitter layer, the collector electrode being in contact with the collector layer, the base electrode being in contact with the base layer, the emitter electrode being in contact with the emitter layer; a protective layer disposed on one surface of the semiconductor element; an emitter redistribution layer electrically connected to the emitter electrode via a contact hole in the protective layer; and a stress-relieving layer disposed between the emitter redistribution layer and the emitter layer in a direction perpendicular to a surface of the compound semiconductor substrate.

According to preferred embodiments of the present invention, a semiconductor device with reduced thermal stress can be provided.

Other features, elements, characteristics and advantages of the present disclosure will become more apparent from the following detailed description of preferred embodiments of the present disclosure with reference to the attached drawings.

DETAILED DESCRIPTION OF THE DISCLOSURE

Semiconductor devices according to embodiments of the present disclosure will hereinafter be described in detail with reference to the drawings. These embodiments are not intended to limit the scope of the invention. It should be understood that the various embodiments are merely illustrative; partial substitutions and combinations of configurations illustrated in different embodiments are possible. For the second and subsequent embodiments, the same features as those of the first embodiment are not described, and only different features are described. In particular, similar advantageous effects achieved by similar configurations are not mentioned for each embodiment.

First Embodiment

Figure 1:
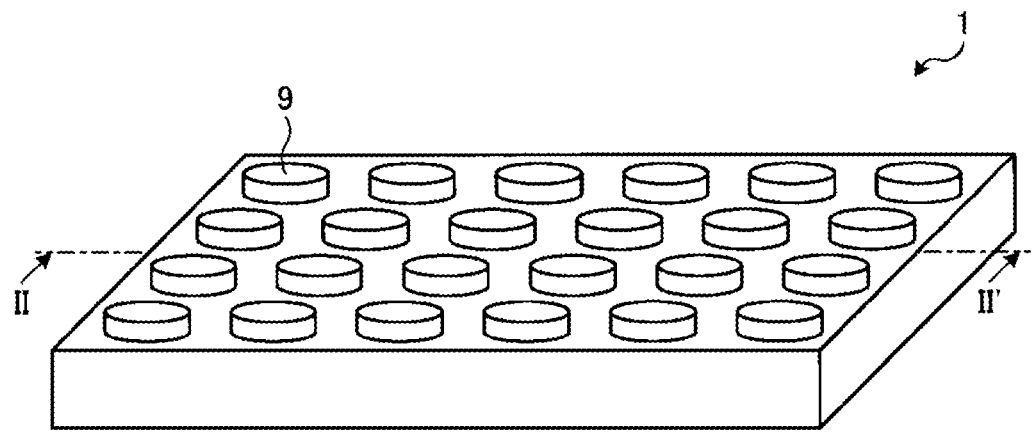
FIG. 1 is a perspective view of a semiconductor device according to a first embodiment.
Figure 2:
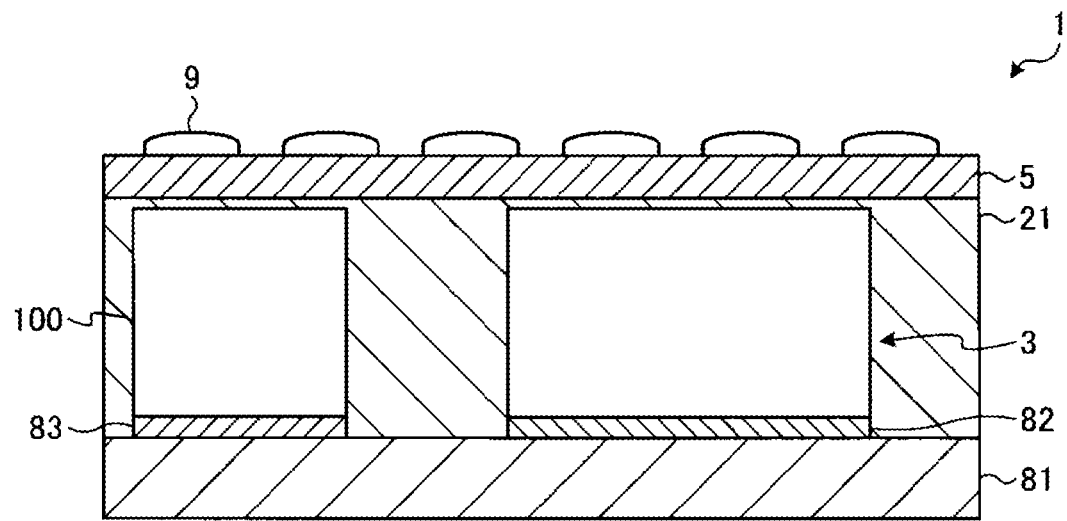
FIG. 2 is a sectional view taken along line II-II' in FIG. 1.

FIG. 1 is a perspective view of a semiconductor device according to a first embodiment. FIG. 2 is a sectional view taken along line II-II' in FIG. 1. As shown in FIG. 2, a semiconductor device 1 according to this embodiment includes a support substrate 81, a semiconductor element 3, a surface mount device (SMD) 100, a first resin layer 21, a redistribution layer 5, and bumps 9. The semiconductor element 3 includes heterojunction bipolar transistors (HBTs). The surface mount device 100 is, for example, an inductor or a capacitor. The semiconductor element 3 and the surface mount device 100 are bonded to the support substrate 81 with bonding layers 82 and 83, respectively. The support substrate 81 may be, for example, a metal substrate or a ceramic substrate such as an alumina substrate. Although FIG. 2 shows one semiconductor element 3 and one surface mount device 100 for illustration purposes, the semiconductor device 1 may include a plurality of semiconductor elements 3 and a plurality of surface mount devices 100. In FIG. 2, the connections between the semiconductor element 3 and the redistribution layer 5 and the connections between the surface mount device 100 and the redistribution layer 5 are omitted for brevity. As described in detail later with reference to FIGS. 4 and 5, the semiconductor element 3 and the surface mount device 100 are connected to the redistribution layer 5 via contact holes such as contact holes H3, H5, and H9.

The first resin layer 21 is disposed over the support substrate 81 and covers the semiconductor element 3 and the surface mount device 100. The first resin layer 21 is a protective layer formed of an insulating resin material. The redistribution layer 5 is disposed on the first resin layer 21. The redistribution layer 5 includes redistribution layers such as a first emitter redistribution layer 54 and a second emitter redistribution layer 56 (see FIG. 4) and electrically connects the semiconductor element 3 to the bumps 9. The redistribution layer 5 also electrically connects the surface mount device 100 to the bumps 9.

As shown in FIG. 1, the bumps 9 are disposed on one surface of the semiconductor device 1. The bumps 9 are external terminals of the semiconductor device 1 and are formed of, for example, a metal such as solder. The bumps 9 have substantially the same shape and are arranged in a matrix at regular intervals. FIG. 1, however, is merely illustrative; the bumps 9 may have different shapes and sizes and may be arranged at different intervals.

Figure 3:
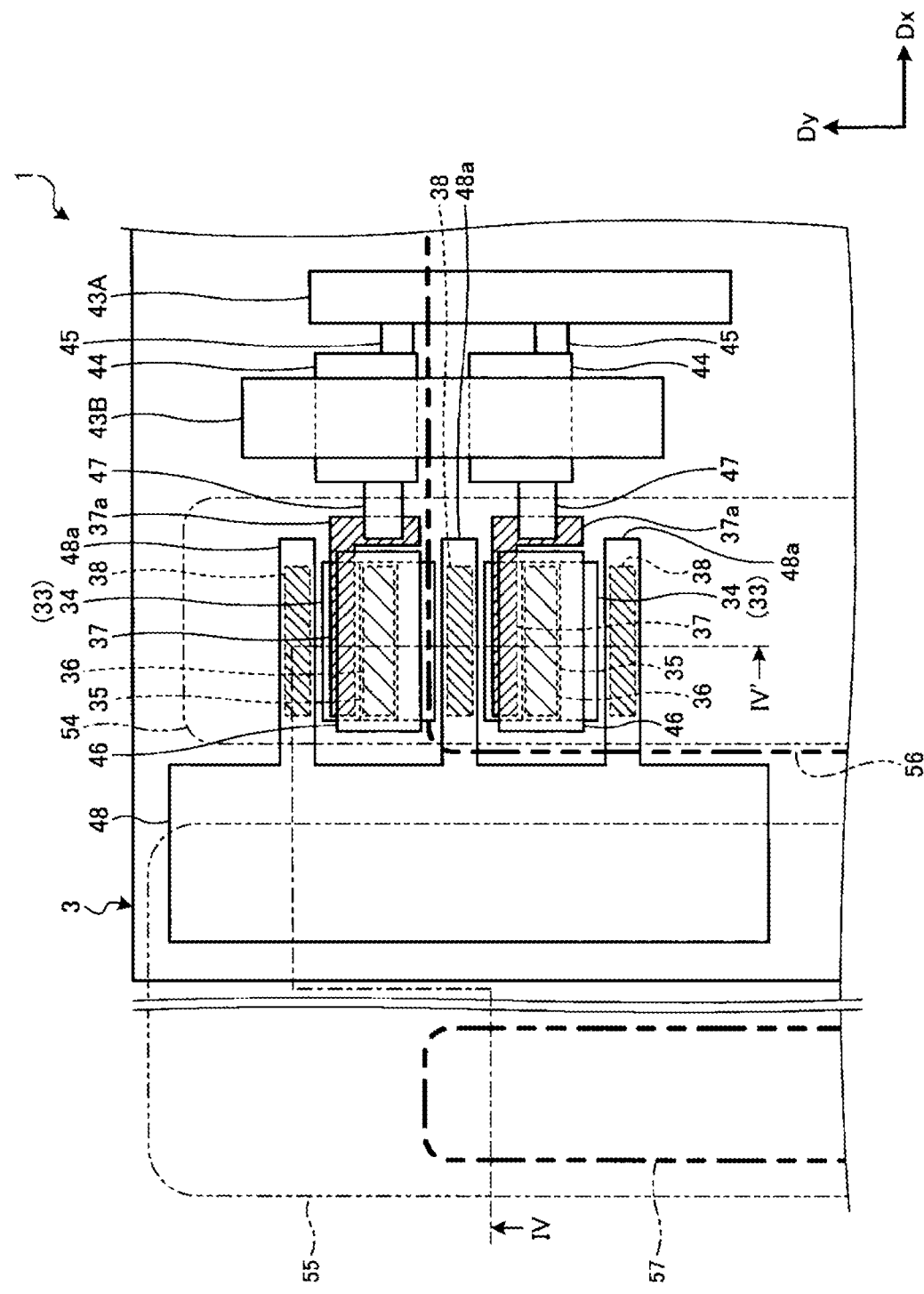
FIG. 3 is a plan view schematically showing a region including a portion of a semiconductor element of the semiconductor device according to the first embodiment.
Figure 4:
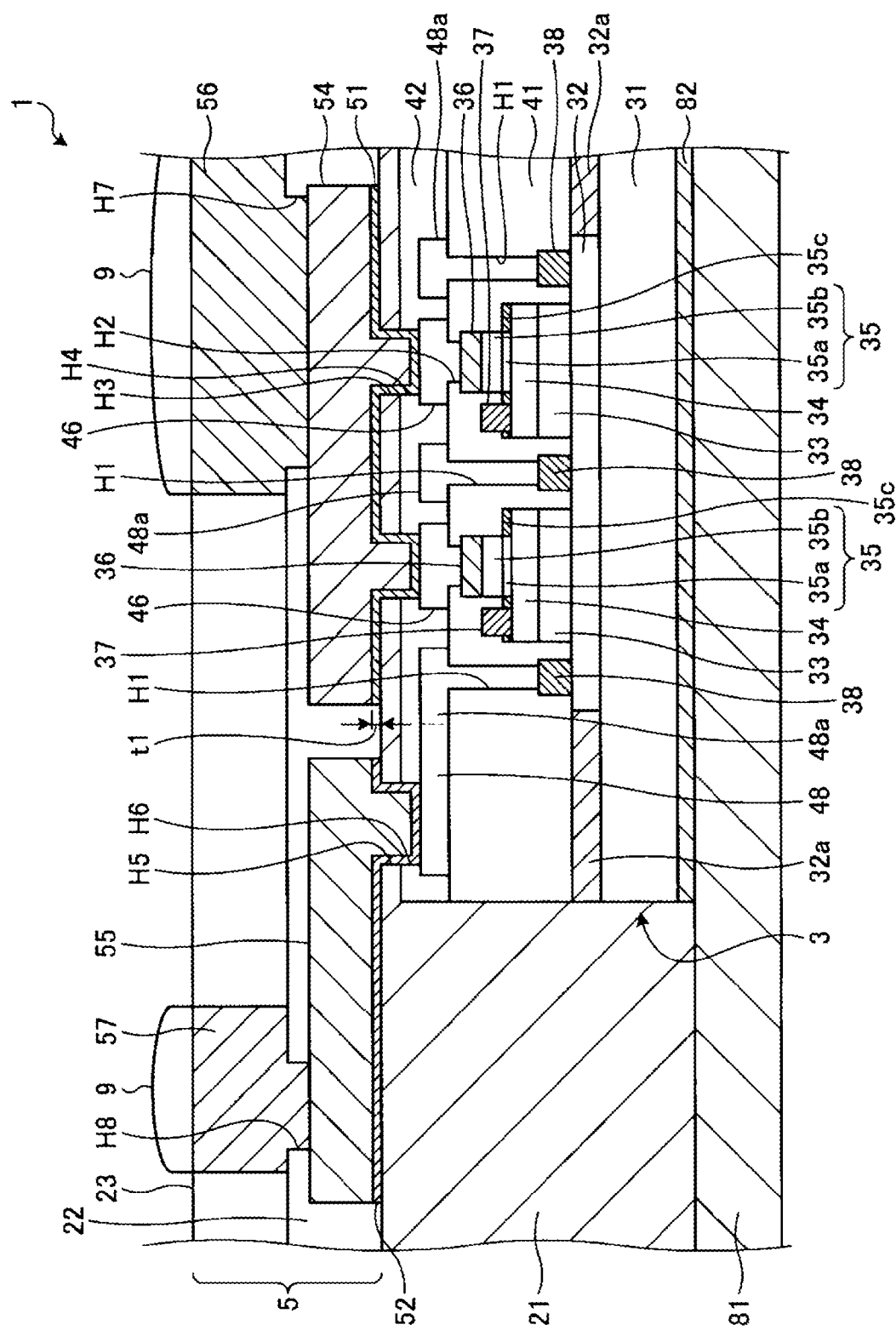
FIG. 4 is a sectional view taken along line IV-IV' in FIG. 3.
Figure 5:
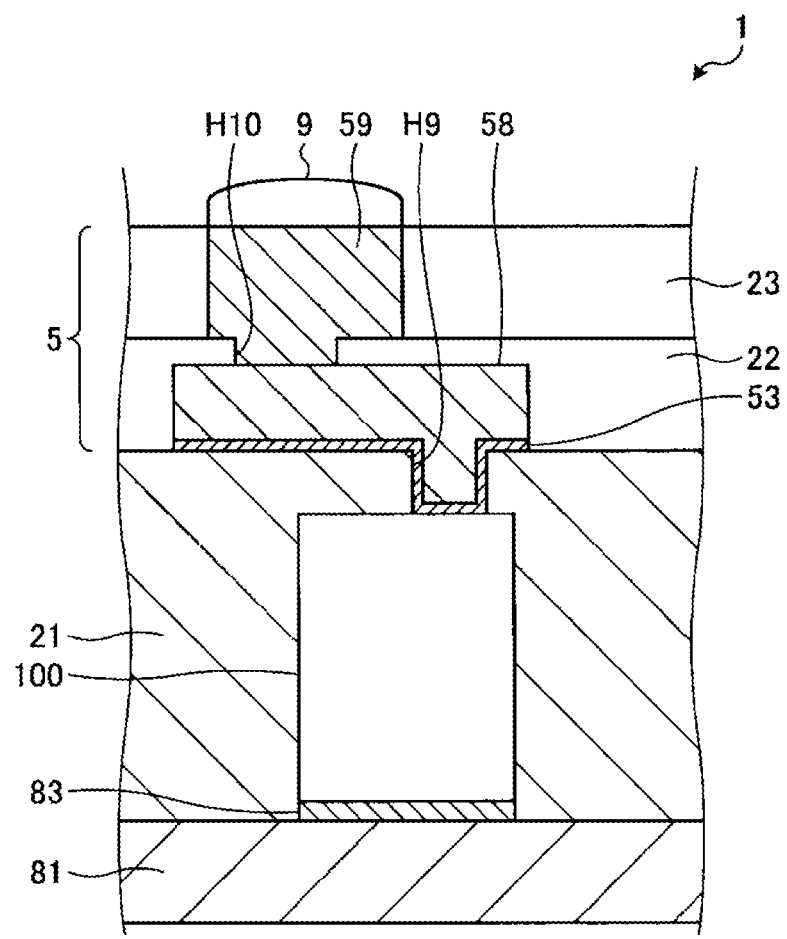
FIG. 5 is a sectional view schematically showing the connection between a surface mount device and a bump of the semiconductor device according to the first embodiment.

FIG. 3 is a plan view schematically showing a region including a portion of the semiconductor element of the semiconductor device according to the first embodiment. FIG. 4 is a sectional view taken along line IV-IV' in FIG. 3. FIG. 5 is a sectional view schematically showing the connection between the surface mount device and a bump of the semiconductor device according to the first embodiment. FIG. 3 schematically shows the relationship between the semiconductor element 3 and various redistribution lines disposed over the semiconductor element 3.

As shown in FIG. 4, the semiconductor element 3 includes a compound semiconductor substrate 31, a subcollector layer 32, collector layers 33, base layers 34, emitter layers 35, collector electrodes 38, base electrodes 37, and emitter electrodes 36. The semiconductor element 3 also includes a first insulating layer 41, a second insulating layer 42, a collector line 48, base lines 47 (see FIG. 3), and emitter lines 46. The collector line 48, the base lines 47, and the emitter lines 46 are disposed on the first insulating layer 41.

The compound semiconductor substrate 31 is, for example, a semi-insulating gallium arsenide (GaAs) substrate. The subcollector layer 32, the collector layers 33, the base layers 34, and the emitter layers 35 are stacked in that order on the compound semiconductor substrate 31. The subcollector layer 32 is a heavily doped n-type GaAs layer with a thickness of, for example, about 0.5 μm. The collector layers 33 are n-type GaAs layers with a thickness of, for example, about 1 μm. The base layers 34 are p-type GaAs layers with a thickness of, for example, about 100 nm. An isolation layer 32a is disposed adjacent to the subcollector layer 32 on the compound semiconductor substrate 31. The isolation layer 32a is an insulating layer formed by ion implantation. The isolation layer 32a is intended for element isolation.

The emitter layers 35 each include an intrinsic emitter layer 35a and an emitter mesa layer 35b. The intrinsic emitter layers 35a and the emitter mesa layers 35b are stacked in that order on the base layers 34. The intrinsic emitter layers 35a are n-type indium gallium phosphide (InGaP) layers with a thickness of, for example, from about 30 nm to about 40 nm. The emitter mesa layers 35b each include a heavily doped n-type GaAs layer and a heavily doped n-type InGaAs layer. The heavily doped n-type GaAs layer and the heavily doped n-type InGaAs layer each have a thickness of, for example, about 100 nm. The heavily doped n-type InGaAs layers of the emitter mesa layers 35b are intended to make ohmic contact with the emitter electrodes 36.

The intrinsic emitter layers 35a, on which the emitter mesa layers 35b are disposed, function as the original emitter operating regions to allow a current to flow through the bipolar transistors. The intrinsic emitter layers 35a have substantially the same shape and size as the emitter mesa layers 35b in a plan view. Protective layers 35c are also disposed on the base layers 34. The protective layers 35c are n-type InGaP layers, as are the intrinsic emitter layers 35a. That is, the n-type InGaP layers disposed on the base layers 34 function as the intrinsic emitter layers 35a in regions overlapping with the emitter mesa layers 35b and function as the protective layers 35c in regions not overlapping with the emitter mesa layers 35b.

As shown in FIG. 4, the collector electrodes 38 are disposed on and in contact with the subcollector layer 32. The collector electrodes 38 are multilayer films, each including a gold-germanium (AuGe) film, a nickel (Ni) film, and a gold (Au) film that are stacked in that order. The AuGe film has a thickness of, for example, about 60 nm. The Ni film has a thickness of, for example, about 10 nm. The Au film has a thickness of, for example, about 200 nm.

The base electrodes 37 are disposed on and in contact with the base layers 34. The base electrodes 37 are multilayer films, each including a Ti film, a Pt film, and a Au film that are stacked in that order. The Ti film has a thickness of, for example, about 50 nm. The Pt film has a thickness of, for example, about 50 nm. The Au film has a thickness of, for example, about 200 nm.

The emitter electrodes 36 are disposed on and in contact with the emitter mesa layers 35b of the emitter layers 35. The emitter electrodes 36 are titanium (Ti) films. The Ti films have a thickness of, for example, about 50 nm.

The first insulating layer 41 is disposed over the subcollector layer 32 and the isolation layer 32a and covers the emitter electrodes 36, the base electrodes 37, and the collector electrodes 38. The first insulating layer 41 is, for example, a silicon nitride (SiN) layer. The first insulating layer 41 may be a single layer or may include a plurality of nitride or oxide layers stacked on top of each other. The first insulating layer 41 may also have a multilayer structure including a SiN layer and a resin layer.

The emitter lines 46, the base lines 47 (see FIG. 3), and the collector line 48 are disposed on the first insulating layer 41. The emitter lines 46, the base lines 47, and the collector line 48 are, for example, gold (Au) films. The emitter lines 46, the base lines 47, and the collector line 48 have a thickness of, for example, about 1 μm. The first insulating layer 41 has contact holes corresponding to the emitter electrodes 36, the base electrodes 37, and the collector electrodes 38, such as contact holes H1 and H2. The emitter lines 46 are connected to the emitter electrodes 36 via the contact holes H2. The collector line 48 is connected to the collector electrodes 38 via the contact holes H1. Although not shown, the base lines 47 are also connected to the base electrodes 37 via contact holes in the first insulating layer 41.

The second insulating layer 42 is disposed over the first insulating layer 41 and covers the emitter lines 46, the base lines 47, and the collector line 48. The second insulating layer 42 is a single-layer SiN film or a multilayer structure including a single-layer SiN film and a resin layer formed thereon. The second insulating layer 42 may also be a multilayer film including a plurality of nitride or oxide layers stacked on top of each other. The second insulating layer 42 is a so-called passivation film. The second insulating layer 42 has contact holes H4 and H6 at positions overlapping the emitter lines 46 and the collector line 48, respectively. The emitter lines 46 and the collector line 48 are exposed at the bottom surfaces of the contact holes H4 and H6, respectively.

A large number of semiconductor elements 3 are formed on one compound semiconductor substrate 31 (wafer). The semiconductor elements 3 are singulated by a technique such as dicing and are mounted as semiconductor chips on support substrates 81.

The first resin layer 21 is disposed over the second insulating layer 42 of the semiconductor element 3. The redistribution layer 5 is disposed on the first resin layer 21. The redistribution layer 5 includes a first emitter redistribution layer 54, a second emitter redistribution layer 56, a first collector redistribution layer 55, a second collector redistribution layer 57, a first stress-relieving layer 51, and a second stress-relieving layer 52.

The first emitter redistribution layer 54 and the first collector redistribution layer 55 are disposed over the first resin layer 21. The first resin layer 21 has contact holes H3 and H5 at positions overlapping with the emitter lines 46 and the collector line 48, respectively. The contact holes H3 in the first resin layer 21 communicate with the contact holes H4 in the second insulating layer 42. The contact hole H5 in the first resin layer 21 communicates with the contact hole H6 in the second insulating layer 42.

The first stress-relieving layer 51 is disposed under and in contact with the first emitter redistribution layer 54. In other words, the first stress-relieving layer 51 is disposed between the first emitter redistribution layer 54 and the emitter layers 35 in the direction perpendicular to the surface of the compound semiconductor substrate 31. The first stress-relieving layer 51 is also disposed on the bottom and side surfaces of the contact holes H3 and H4. The first stress-relieving layer 51 is disposed between the first resin layer 21 and the first emitter redistribution layer 54 in the region where the contact holes H3 and H4 are not formed. The first emitter redistribution layer 54 and the first stress-relieving layer 51 are electrically connected to the emitter lines 46 via the contact holes H3 and H4. Thus, the first emitter redistribution layer 54 is electrically connected to the emitter layers 35 through the emitter electrodes 36.

The second stress-relieving layer 52 is disposed under and in contact with the first collector redistribution layer 55. In other words, the second stress-relieving layer 52 is disposed between the first collector redistribution layer 55 and the collector layers 33 in the direction perpendicular to the surface of the compound semiconductor substrate 31. The second stress-relieving layer 52 is also disposed on the bottom and side surfaces of the contact holes H5 and H6. The second stress-relieving layer 52 is disposed between the first resin layer 21 and the first collector redistribution layer 55 in the region where the contact holes H5 and H6 are not formed. The first collector redistribution layer 55 and the second stress-relieving layer 52 are electrically connected to the collector line 48 via the contact holes H5 and H6. Thus, the first collector redistribution layer 55 is electrically connected to the collector layers 33 through the collector electrodes 38.

As shown in FIG. 4, the first stress-relieving layer 51 is disposed under the entire bottom surface of the first emitter redistribution layer 54. The first stress-relieving layer 51, however, may overlap with a portion of the first emitter redistribution layer 54 and may be disposed on at least the bottom surfaces of the contact holes H3 and H4. Similarly, the second stress-relieving layer 52 may overlap with a portion of the first collector redistribution layer 55 and may be disposed on at least the bottom surface of the contact holes H5 and H6.

The first emitter redistribution layer 54 and the first collector redistribution layer 55 are formed of, for example, a metal material such as copper (Cu) or aluminum (Al). The first emitter redistribution layer 54 and the first collector redistribution layer 55 have a thickness of, for example, from about 5 μm to about 20 μm. The first stress-relieving layer 51 and the second stress-relieving layer 52 are formed of a high-melting-point metal or a compound or alloy thereof, for example, tungsten-titanium (TiW), titanium (Ti), tungsten (W), or tungsten silicide (WSi). The first stress-relieving layer 51 and the second stress-relieving layer 52 may each be a single layer or a multilayer film including a plurality of layers of different materials that are stacked on top of each other.

A second resin layer 22 is disposed over the first resin layer 21 and covers the first emitter redistribution layer 54 and the first collector redistribution layer 55. The second resin layer 22 has contact holes H7 and H8 at positions overlapping with the first emitter redistribution layer 54 and the first collector redistribution layer 55, respectively. The first emitter redistribution layer 54 and the first collector redistribution layer 55 are exposed at the bottom surfaces of the contact holes H7 and H8, respectively.

A third resin layer 23, the second emitter redistribution layer 56, and the second collector redistribution layer 57 are disposed over the second resin layer 22. The second emitter redistribution layer 56 and the second collector redistribution layer 57 are disposed in openings in the third resin layer 23. The second emitter redistribution layer 56 is connected to the first emitter redistribution layer 54 via the contact hole H7. The second collector redistribution layer 57 is connected to the first collector redistribution layer 55 via the contact hole H8. The bumps 9 are disposed on the second emitter redistribution layer 56 and the second collector redistribution layer 57.

In the foregoing configuration, the emitter layers 35 and the collector layers 33 of the semiconductor element 3 are electrically connected to the bumps 9 through the various redistribution lines of the redistribution layer 5.

The positional relationship between the emitter layers 35 of the semiconductor element 3 and the first emitter redistribution layer 54 will be described next with reference to FIG. 3. In FIG. 3, the first stress-relieving layer 51 and the second stress-relieving layer 52 are not shown. In FIG. 3, the first emitter redistribution layer 54, the first collector redistribution layer 55, the second emitter redistribution layer 56, and the second collector redistribution layer 57 are indicated by two-dot chain lines.

As shown in FIG. 3, there are two collector layers 33, two base layers 34, and two emitter layers 35. That is, the semiconductor element 3 includes two unit transistors, each including a collector layer 33, a base layer 34, and an emitter layer 35. A plurality of collector electrodes 38, a plurality of base electrodes 37, and a plurality of emitter electrodes 36 are provided for the collector layers 33, the base layers 34, and the emitter layers 35, respectively. In FIG. 3, the collector layers 33, the base layers 34, and the emitter layers 35 are arranged in a second direction Dy. The collector electrodes 38, the base electrodes 37, and the emitter electrodes 36 are arranged in the second direction Dy in the following order: a collector electrode 38, an emitter electrode 36, a base electrode 37, a collector electrode 38, an emitter electrode 36, a base electrode 37, and a collector electrode 38. The two base electrodes 37, the two emitter electrodes 36, and the three collector electrodes 38 overlap with each other in a first direction Dx.

The first direction Dx and the second direction Dy are parallel to the surface of the compound semiconductor substrate 31 and are orthogonal to each other. Although FIG. 3 shows two collector layers 33, two base layers 34, and two emitter layers 35, the semiconductor element 3 may include three or more unit transistors. In this case, the number of collector electrodes 38, the number of base electrodes 37, and the number of emitter electrodes 36 can be appropriately changed depending on the number of unit transistors.

As shown in FIG. 3, the two emitter layers 35 overlap with the first emitter redistribution layer 54. The two emitter layers 35 are located within the contours of the first emitter redistribution layer 54 in a plan view. The two emitter electrodes 36, which are located at substantially the same positions as the emitter layers 35, overlap with the first emitter redistribution layer 54 in a plan view. That is, the first emitter redistribution layer 54 is disposed exactly over the emitter layers 35, which are transistor semiconductor layers. The two emitter layers 35 are separated from each other and are not connected to each other. The two emitter lines 46 are also separated from each other and correspond to the two respective emitter layers 35. That is, the two emitter layers 35 are not connected to each other through the emitter lines 46.

As shown in FIG. 4, the two emitter layers 35 are electrically connected to each other through the first emitter redistribution layer 54 and the first stress-relieving layer 51. That is, the two unit transistors are connected together through the first emitter redistribution layer 54. Thus, the unit transistors of the semiconductor element 3 function as a single transistor.

In this embodiment, the first emitter redistribution layer 54 is disposed in a layer different from the emitter lines 46, which are disposed inside the semiconductor element 3. The emitter layers 35 are connected to the common first emitter redistribution layer 54. This eliminates the need to provide a wiring line for connecting the emitter layers 35 inside the semiconductor element 3. More specifically, components such as the emitter lines 46, which are formed of Au, need not be provided in two or more layers. Thus, the semiconductor element 3 can be manufactured at a reduced cost.

As shown in FIG. 3, the first emitter redistribution layer 54 also overlaps with the two base electrodes 37 and the three collector electrodes 38. The collector line 48 of the semiconductor element 3 is disposed at a position not overlapping with the first emitter redistribution layer 54. The collector line 48 is disposed in the second direction Dy, i.e., parallel to the direction in which the collector electrodes 38 are arranged. The collector line 48 has three collector connection lines 48a extending in the first direction Dx. The three collector connection lines 48a are connected to the three respective collector electrodes 38. As a result, the three collector electrodes 38 are connected to the common collector line 48.

The first collector redistribution layer 55 is disposed at a position not overlapping with the first emitter redistribution layer 54, and at least a portion of the first collector redistribution layer 55 overlaps with the collector line 48. Thus, the collector line 48 and the first collector redistribution layer 55 can be electrically connected to each other.

At least a portion of the second emitter redistribution layer 56 may overlap with the first emitter redistribution layer 54. Similarly, at least a portion of the second collector redistribution layer 57 may overlap with the first collector redistribution layer 55. The positions, shapes, and other properties of the second emitter redistribution layer 56 and the second collector redistribution layer 57 can be appropriately changed depending on, for example, the positions of the bumps 9 to which they are connected. The semiconductor device 1 according to this embodiment includes the first emitter redistribution layer 54, the second emitter redistribution layer 56, the first collector redistribution layer 55, and the second collector redistribution layer 57. This allows the bumps 9 and the semiconductor element 3 to be connected to each other with improved flexibility. Thus, the semiconductor element 3 and the bumps 9 of the semiconductor device 1 can be easily connected to each other irrespective of the shape and arrangement of the bumps 9.

Although the emitter layers 35 are located within the contours of the first emitter redistribution layer 54, at least portions of the emitter layers 35 may overlap with the first emitter redistribution layer 54. If the emitter layers 35 include portions located outside the contours of the first emitter redistribution layer 54, the heat dissipation from the emitter layers 35 decreases slightly. Nevertheless, the emitter layers 35 in this case are partially covered by the first emitter redistribution layer 54, which allows the heat to be dissipated from the nearby first emitter redistribution layer 54.

As shown in FIG. 3, each base electrode 37 has a base connection 37a at one end thereof. The base connections 37a extend in the second direction Dy and are located adjacent to the emitter electrodes 36 in the first direction Dx. The base lines 47 are connected to the base electrodes 37 through the base connections 37a. The base lines 47 are also connected to resistors 45 through underlying electrodes 44. The two base lines 47, the two underlying electrodes 44, and the two resistors 45 correspond to the two respective base electrodes 37.

The two resistors 45 are in turn connected to a common first signal supply line 43A. A common second signal supply line 43B overlaps with the two underlying electrodes 44. A SiN film is disposed between the underlying electrodes 44 and the second signal supply line 43B. Thus, the underlying electrodes 44 and the second signal supply line 43B constitute a metal-insulator-metal (MIM) structure, thereby forming an MIM capacitance between the underlying electrodes 44 and the second signal supply line 43B. The base layers 34 receive radio-frequency signals from the second signal supply line 43B. The base layers 34 receive a DC bias current from the first signal supply line 43A through the resistors 45. The resistors 45 are effective in stabilizing the transistor current. The resistors 45 may be formed of a material such as tantalum nitride (TaN) or nickel-chromium (NiCr).

Although not shown, the second signal supply line 43B is connected to a bump 9 through a second base redistribution layer disposed in the redistribution layer 5. Thus, the second signal supply line 43B receives radio-frequency signals from the bump 9. Similarly, the first signal supply line 43A is connected to a first base redistribution layer disposed in the redistribution layer 5, for example, through a bias circuit. Thus, the first signal supply line 43A receives signals serving as a DC bias current from a bump 9.

The connection configuration between the surface mount device 100 and a bump 9 will be described next. As shown in FIG. 5, the redistribution layer 5 further includes a first SMD redistribution layer 58, a second SMD redistribution layer 59, and a third stress-relieving layer 53. The first SMD redistribution layer 58, the second SMD redistribution layer 59, and the third stress-relieving layer 53 are disposed in the same layers as the first emitter redistribution layer 54, the second emitter redistribution layer 56, and the first stress-relieving layer 51, respectively, shown in FIG. 4. The first SMD redistribution layer 58 is disposed on the first resin layer 21. The first resin layer 21 has a contact hole H9 at a position overlapping a terminal of the surface mount device 100.

The third stress-relieving layer 53 is disposed under and in contact with the first SMD redistribution layer 58. In other words, the third stress-relieving layer 53 is disposed between the first SMD redistribution layer 58 and the surface mount device 100 in the direction perpendicular to the surface of the support substrate 81. The first SMD redistribution layer 58 and the third stress-relieving layer 53 are electrically connected to the surface mount device 100 via the contact hole H9.

The second resin layer 22 has a contact hole H10 at a position overlapping with the first SMD redistribution layer 58. The first SMD redistribution layer 58 is exposed at the bottom surface of the contact hole H10. The second SMD redistribution layer 59 is disposed on the second resin layer 22. The second SMD redistribution layer 59 is connected to the first SMD redistribution layer 58 via the contact hole H10. A bump 9 is disposed on the second SMD redistribution layer 59. In the foregoing configuration, the surface mount device 100 disposed on the support substrate 81 is electrically connected to the bump 9 through the redistribution layer 5.

The thermal stress acting on the semiconductor element 3 will be described next. As shown in FIG. 4, the semiconductor device 1 according to this embodiment includes the first stress-relieving layer 51 under the first emitter redistribution layer 54. The first stress-relieving layer 51 is formed of a high-melting-point metal as described above. The thermal expansion coefficient of the high-melting-point metal is close to that of the GaAs layers such as the emitter layers 35. Thus, the thermal stress acting on the emitter layers 35 of the semiconductor element 3 can be relieved.

Figure 6:
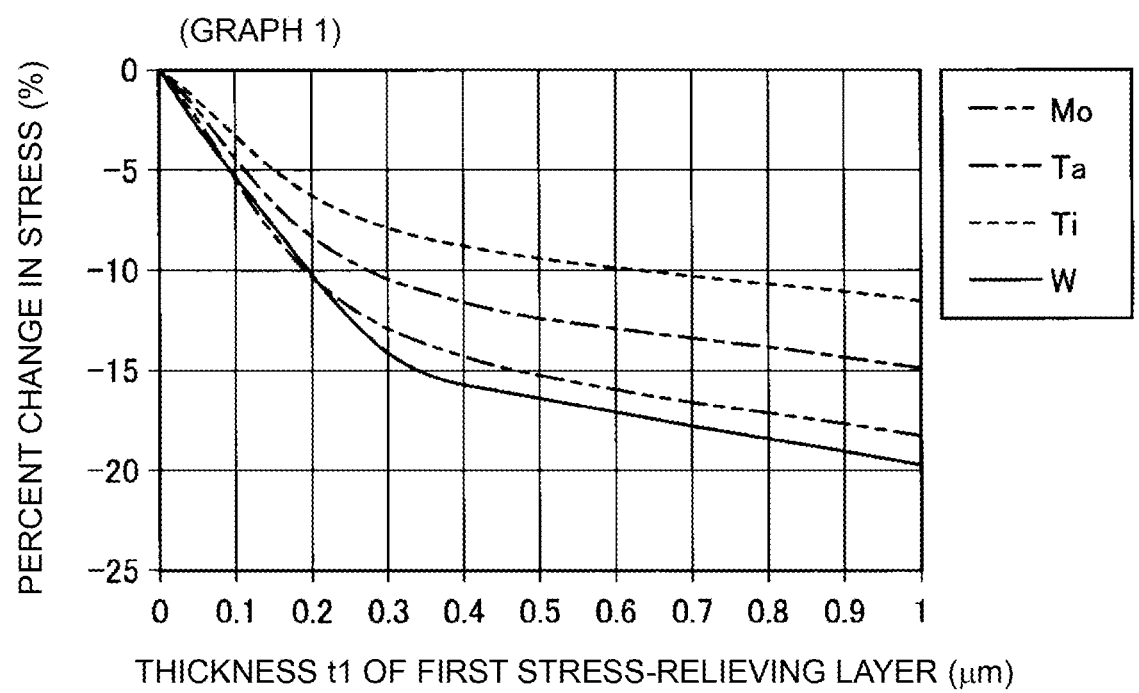
FIG. 6 is a graph showing the relationship between the thickness of a first stress-relieving layer according to the first embodiment and the percent change in stress.

FIG. 6 is a graph showing the relationship between the thickness of the first stress-relieving layer according to the first embodiment and the percent change in stress. Graph 1 in FIG. 6 shows the relationship between the thickness t1 (see FIG. 4) of the first stress-relieving layer 51 and the percent change in stress for each material used for the first stress-relieving layer 51. The materials used for the first stress-relieving layer 51 are molybdenum (Mo), tantalum (Ta), titanium (Ti), and tungsten (W). The percent change in stress in FIG. 6 shows the evaluation results obtained by simulation. As the simulation conditions, the evaluation is performed on the transistor structure and redistribution structure shown in FIGS. 3 and 4. The shape of the emitter layers 35 in a plan view is set to have a length (a length in the second direction Dy) of 4 µm and a width (a length in the first direction Dx) of 30 µm. The material of the first emitter redistribution layer 54 is Cu, and the shape of the first emitter redistribution layer 54 in a plan view had a length of 300 µm, a width of 80 µm, and a thickness of 10 µm. FIG. 6 shows the results of the calculation of the thermal stress induced by a temperature decrease from 230° C., which is a typical temperature reached during mounting, to 150° C.

As shown in FIG. 6, the horizontal axis of graph 1 indicates the thickness t1 of the first stress-relieving layer 51. The vertical axis indicates the change in the thermal stress on the emitter layers 35. The change in thermal stress is expressed as a relative quantity with respect to the thermal stress induced when the thickness t1 of the first stress-relieving layer 51 is zero, i.e., t1=0. As shown in FIG. 6, no matter which of Mo, Ta, Ti, and W is used for the first stress-relieving layer 51, the thermal stress acting on the emitter layers 35 decreases with increasing thickness t1 of the first stress-relieving layer 51. If the thickness t1 of the first stress-relieving layer 51 is about 100 nm (0.1 µm) or more, the percent change in stress can be reduced by about 3% or more. In particular, if Mo or W is used for the first stress-relieving layer 51, the percent change in stress can be reduced by about 5% or more at thicknesses t1 of about 100 nm or more. It has been confirmed that, if the first stress-relieving layer 51 reduces the thermal stress acting on the emitter layers 35 by 2%, the energization life of the bipolar transistor increases to about 35 times. Thus, the thickness t1 is preferably about 100 nm (0.1 µm) or more.

The use of Mo or W for the first stress-relieving layer 51 allows for a larger reduction in the percent change in stress than the use of Ta or Ti for the first stress-relieving layer 51. At thicknesses t1 of more than about 200 nm, the use of W for the first stress-relieving layer 51 results in a lower percent change in stress than the use of Mo for the first stress-relieving layer 51. For example, at a thickness t1 of about 300 nm, the percent change in stress tends to become lower in the following order: Ti, Ta, Mo, and W. The gradient of the percent change in stress at thicknesses t1 of from about 0 nm to about 300 nm is larger than the gradient of the percent change in stress at thicknesses t1 of more than about 300 nm.

The thermal stress acting on the emitter layers 35 decreases since the thermal expansion coefficients of metals such as Mo, Ta, Ti, and W are close to that of the GaAs layers such as the emitter layers 35. That is, the first stress-relieving layer 51 is formed of a thick metal film that functions as a relieving layer, thus reducing the thermal stress resulting from the difference in thermal expansion coefficient between the Cu forming the first emitter redistribution layer 54 and the GaAs layers such as the emitter layers 35. As shown in FIG. 6, of the high-melting-point metals, W, which has a low thermal expansion coefficient, shows the lowest percent change in stress. That is, W allows for the largest reduction in stress. This suggests that the use of a material with a low thermal expansion coefficient for the first stress-relieving layer 51 may reduce the thermal stress.

Although FIG. 6 illustrates an example where Cu is used as the material for the first emitter redistribution layer 54, similar results can also be achieved when Al is used. Al has a thermal expansion coefficient of 23 ppm/° C.; as does Cu, Al has a higher thermal expansion coefficient than the GaAs layers such as the emitter layers 35. Chromium (Cr) can also be used as an alternative material for the first stress-relieving layer 51. Other materials that may be used for the first stress-relieving layer 51 include alloys and compounds of W, Mo, Ti, Ta, and Cr. Example compounds include high-melting-point metal nitrides and silicides, such as TaN, WSi, and TiW. The first stress-relieving layer 51 may also be a multilayer film of these materials. The thermal stress can also be reduced as in the case of FIG. 6 when these high-melting-point metal compounds and alloys are used. Preferred high-melting-point metal compounds and alloys that can be used include compounds and alloys containing W or Mo, which are highly effective in reducing the thermal stress.

Thus, since the semiconductor device 1 according to this embodiment includes the first stress-relieving layer 51 under the first emitter redistribution layer 54, the thermal stress acting on the emitter layers 35 of the semiconductor element 3 can be reduced. For example, even if a temperature change occurs during process steps such as the assembly and mounting of the semiconductor element 3 of the semiconductor device 1, the thermal stress between the transistor semiconductor regions such as the GaAs layers and the first emitter redistribution layer 54 can be reduced.

As described above, the thermal stress results from the difference in thermal expansion coefficient between the layers such as the emitter layers 35 (e.g., the GaAs layers and the InGaP layers) and the redistribution layers such as the first emitter redistribution layer 54. For example, GaAs layers have a thermal expansion coefficient of 6 ppm/° C. InGaP layers have a thermal expansion coefficient of 5 to 6 ppm/° C., which is close to that of GaAs layers. In contrast, Cu, which forms the various redistribution layers, has a thermal expansion coefficient of 17 ppm/° C., which is higher than those of GaAs layers and InGaP layers. According to this embodiment, the first stress-relieving layer 51 can reduce the thermal stress, thus reducing the likelihood of damage to the semiconductor active layers (particularly the emitter layers 35 and the base layers 34). This prevents the current amplification factor of the bipolar transistors of the semiconductor device 1 from dropping within a short period of time during energization at high temperature, for example, due to the formation of crystal defects in the semiconductor layers after damage to the semiconductor layers. Thus, the semiconductor device 1 including the bipolar transistors exhibits improved reliability.

Since this embodiment includes the first stress-relieving layer 51, the thermal stress can be relieved even if the emitter layers 35 are disposed at positions overlapping with the first emitter redistribution layer 54 in a plan view. Here, the emitter layers 35 are heat-generating regions of the bipolar transistors. The first emitter redistribution layer 54 effectively dissipates the heat generated by the bipolar transistors, thus reducing the temperature rise of the bipolar transistors, particularly when the semiconductor device 1 is used in power transistor applications. As a result, the semiconductor device 1 exhibits less decrease in bipolar transistor performance and therefore improved radio-frequency characteristics.

The first stress-relieving layer 51 is disposed between the first emitter redistribution layer 54 and the emitter layers 35. Thus, even if a Cu-based material is used for the first emitter redistribution layer 54, less Cu diffuses into the semiconductor regions such as the emitter layers 35 and the base layers 34, for example, when the heat treatment is performed during the manufacture. Thus, the semiconductor device 1 exhibits less Cu contamination and therefore less degradation in transistor characteristics.

Although FIG. 6 illustrates the effect of the first stress-relieving layer 51, similar effects can also be achieved by the second stress-relieving layer 52 (see FIG. 4) and the third stress-relieving layer 53. Specifically, the second stress-relieving layer 52 of the semiconductor device 1 can reduce the thermal stress acting on the subcollector layer 32 and the collector layers 33, whereas the third stress-relieving layer 53 of the semiconductor device 1 can reduce the thermal stress acting on the surface mount device 100.

The configuration of the semiconductor device 1 shown in FIGS. 3 to 6 can be appropriately changed. For example, the emitter electrodes 36, the base electrodes 37, and the collector electrodes 38 shown in FIG. 4 may be omitted. In this case, the semiconductor device 1 may have a configuration in which the emitter lines 46 are in direct contact with the emitter layers 35. Similarly, the semiconductor device 1 may have a configuration in which the base lines 47 and the collector line 48 are in direct contact with the base layers 34 and the subcollector layer 32, respectively.

First Modification of First Embodiment

Figure 7:
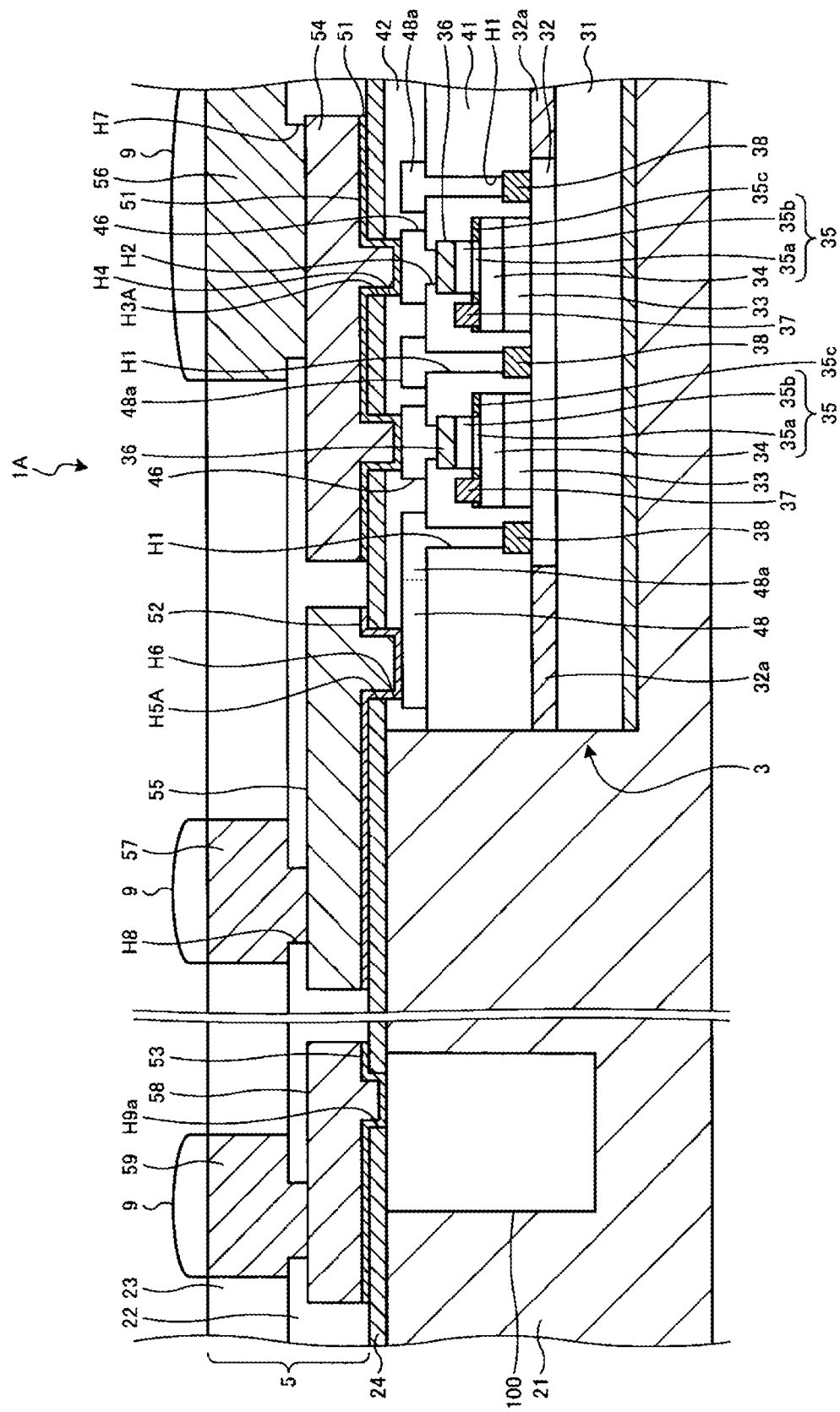
FIG. 7 is a sectional view schematically showing the cross-sectional configuration of a semiconductor device according to a first modification of the first embodiment.

FIG. 7 is a sectional view schematically showing the cross-sectional configuration of a semiconductor device according to a first modification of the first embodiment. In FIG. 7, a portion including the semiconductor element 3 and a portion including the surface mount device 100 of the semiconductor device 1 are schematically shown together. In the following description, the same components as those of the foregoing embodiment are denoted by the same reference numerals to avoid redundancy of description.

As shown in FIG. 7, a semiconductor device 1A according to this modification includes a first resin layer 21 covering the bottom and side surfaces of the semiconductor element 3 and the surface mount device 100. A fourth resin layer 24 is disposed over the top surfaces of the semiconductor element 3 and the surface mount device 100. That is, this modification does not include the support substrate 81 or the bonding layers 82 and 83 (see FIGS. 4 and 5). Thus, the semiconductor device 1A has a reduced package height.

The fourth resin layer 24 is disposed between the redistribution layer 5 and the semiconductor element 3 and is also disposed between the redistribution layer 5 and the surface mount device 100. The fourth resin layer 24 has contact holes H3A and H5A at positions overlapping with the emitter lines 46 and the collector line 48, respectively. The fourth resin layer 24 also has a contact hole H9a at a position overlapping with a terminal of the surface mount device 100. The contact holes H3A in the fourth resin layer 24 communicate with the contact holes H4 in the second insulating layer 42. The contact hole H5A in the fourth resin layer 24 communicates with the contact hole H6 in the second insulating layer 42.

The first emitter redistribution layer 54 and the first stress-relieving layer 51 are electrically connected to the emitter lines 46 via the contact holes H3A and H4. Thus, the first emitter redistribution layer 54 is electrically connected to the emitter layers 35 through the emitter electrodes 36. Similarly, the first collector redistribution layer 55 and the second stress-relieving layer 52 are electrically connected to the collector line 48 via the contact holes H5A and H6. The first SMD redistribution layer 58 and the third stress-relieving layer 53 are electrically connected to the surface mount device 100 via the contact hole H9a.

In this modification, the top surfaces of the semiconductor element 3 and the surface mount device 100 are in contact with the fourth resin layer 24. The top surfaces of the semiconductor element 3 and the surface mount device 100 are located at the same height as the bottom surface of the fourth resin layer 24. That is, the distance between the semiconductor element 3 and the redistribution layer 5 is equal to the distance between the surface mount device 100 and the redistribution layer 5. Thus, the semiconductor element 3 and the surface mount device 100 of the semiconductor device 1A can be easily connected to the various wiring lines of the redistribution layer 5 even if the semiconductor element 3 and the surface mount device 100 have different heights.

Second Modification of First Embodiment

Figure 8:
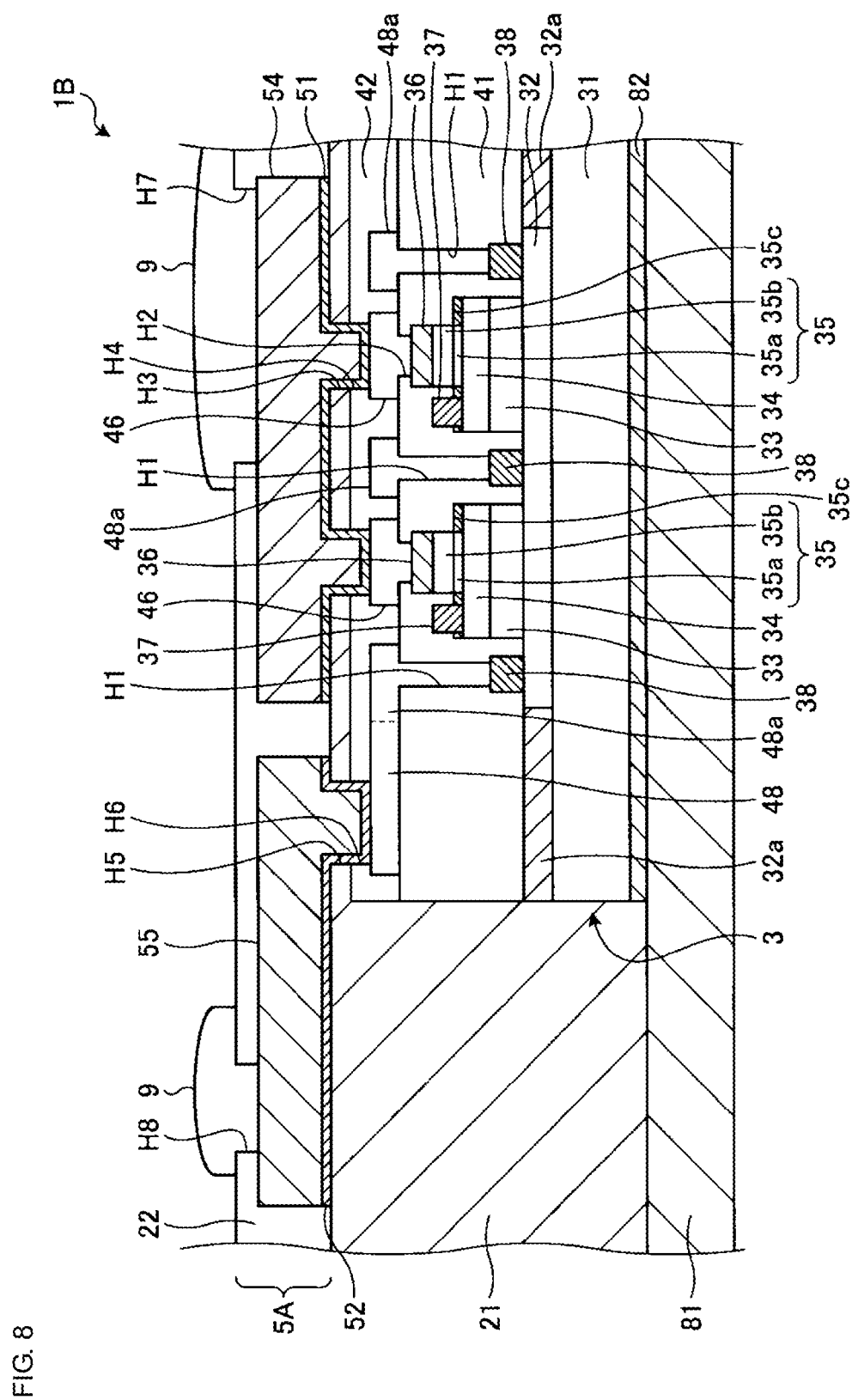
FIG. 8 is a sectional view schematically showing the cross-sectional configuration of a semiconductor device according to a second modification of the first embodiment.

FIG. 8 is a sectional view schematically showing the cross-sectional configuration of a semiconductor device according to a second modification of the first embodiment. As shown in FIG. 8, a semiconductor device 1B according to this modification includes a redistribution layer 5A including the first emitter redistribution layer 54, the first collector redistribution layer 55, and the second resin layer 22. That is, the second emitter redistribution layer 56, the second collector redistribution layer 57, and the third resin layer 23 shown in FIG. 5 can be omitted from the semiconductor device 1B. In addition, the second SMD redistribution layer 59 shown in FIG. 5 can be omitted from the semiconductor device 1B.

As shown in FIG. 8, the first emitter redistribution layer 54 is connected to a bump 9 via the contact hole H7 in the second resin layer 22. The first collector redistribution layer 55 is connected to a bump 9 via the contact hole H8 in the second resin layer 22. Although not shown, the surface mount device 100 (see FIG. 5) is also connected to a bump 9 through the first SMD redistribution layer 58.

The semiconductor device 1B according to this modification includes a reduced number of layers forming the redistribution layer 5A. Thus, the semiconductor device 1B has a reduced package height. In addition, the steps of connecting the semiconductor element 3 and the surface mount device 100 to the bumps 9 are simplified. Thus, the semiconductor device 1B can be manufactured at a reduced cost.

Third Modification of First Embodiment

Figure 9:
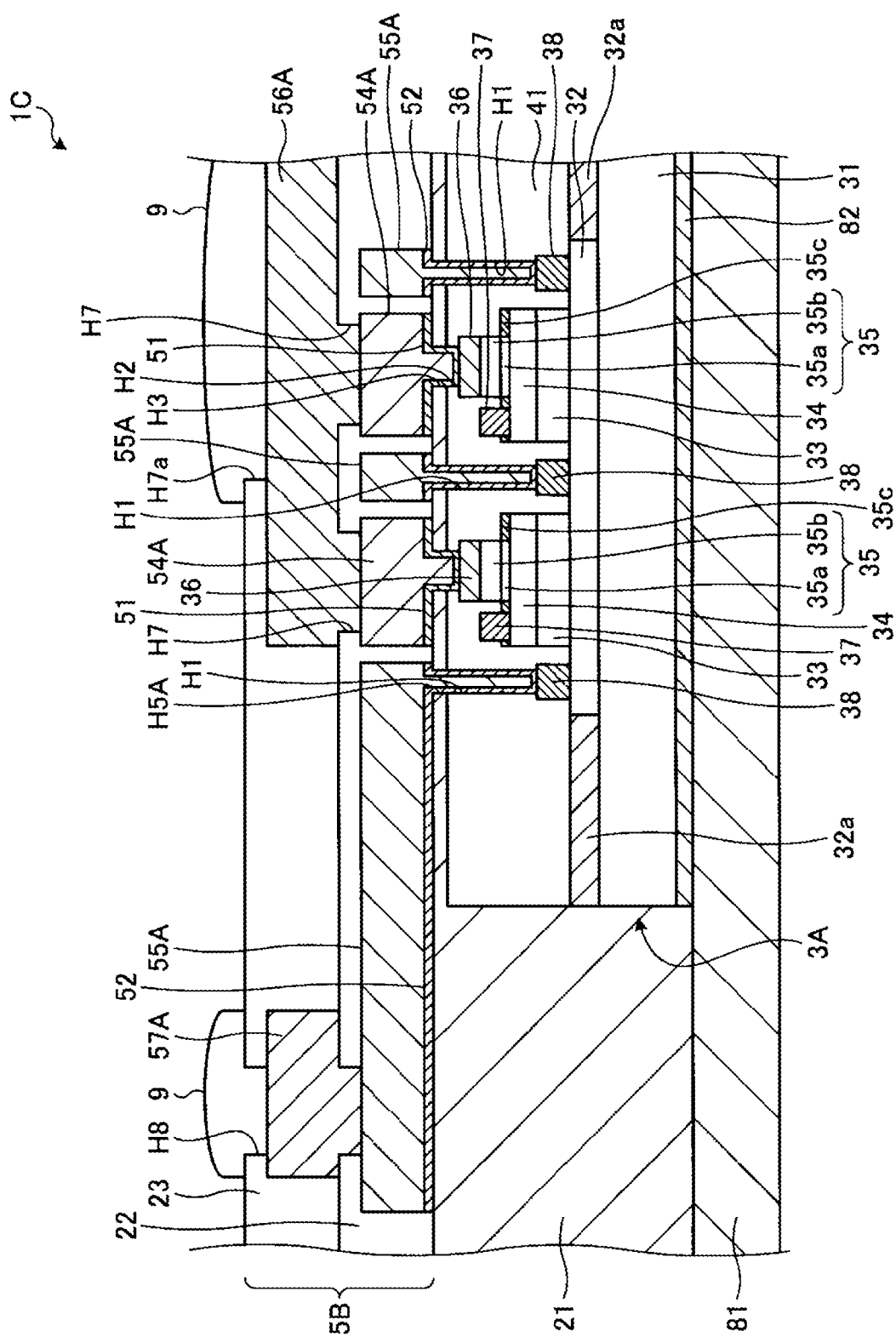
FIG. 9 is a sectional view schematically showing the cross-sectional configuration of a semiconductor device according to a third modification of the first embodiment.

FIG. 9 is a sectional view schematically showing the cross-sectional configuration of a semiconductor device according to a third modification of the first embodiment. As shown in FIG. 9, a semiconductor device 1C according to this modification includes a semiconductor element 3A including a first insulating layer 41 over which the first resin layer 21 is disposed. A redistribution layer 5B is disposed on the first resin layer 21. That is, components such as the emitter lines 46, the collector line 48, and the second insulating layer 42 shown in FIG. 4 can be omitted from the semiconductor device 1C.

In this modification, first emitter redistribution layers 54A and first stress-relieving layers 51 are connected to the emitter electrodes 36 via contact holes H2 and H3. A first collector redistribution layer 55A and a second stress-relieving layer 52 are connected to the collector electrodes 38 via contact holes H1 and H5A. In this modification, the emitter electrodes 36 are electrically connected to each other through the first emitter redistribution layers 54A and a second emitter redistribution layer 56A. Similarly, the collector electrodes 38 are electrically connected to each other through the first collector redistribution layer 55A and a second collector redistribution layer 57A.

The redistribution layer 5B includes a redistribution layer connected to the emitter electrodes 36, a redistribution layer connected to the collector electrodes 38, and a redistribution layer (not shown) connected to the base electrodes 37 such that the redistribution layers intersect with each other in a plan view as needed. For example, the collector electrodes 38 are connected to the common first collector redistribution layer 55A. The configuration of the first collector redistribution layer 55A in a plan view may be similar to that of the collector line 48 shown in FIG. 3. The second collector redistribution layer 57A is connected to the first collector redistribution layer 55A via a contact hole H1. A bump 9 is connected to the second collector redistribution layer 57A via a contact hole H8.

The first emitter redistribution layers 54A and the first stress-relieving layers 51 are separated from each other and correspond to the respective emitter electrodes 36. The second emitter redistribution layer 56A is connected to the first emitter redistribution layers 54A via contact holes H7. Thus, the emitter electrodes 36 are electrically connected to the common second emitter redistribution layer 56A. A bump 9 is connected to the second emitter redistribution layer 56A via a contact hole H7a. At least a portion of the second emitter redistribution layer 56A overlaps with the first emitter redistribution layers 54A in a plan view. The second emitter redistribution layer 56A intersects with portions of the first collector redistribution layer 55A in a plan view.

In the semiconductor device 1C according to this modification, the various redistribution layers of the redistribution layer 5B can be arranged to achieve the connection configuration formed by components such as the emitter lines 46 and the collector line 48 (see FIG. 4) disposed in the semiconductor element 3. Thus, components such as the emitter lines 46 and the collector line 48, which are formed of, for example, Au, can be omitted from the semiconductor device 1C, and accordingly, the semiconductor element 3A can be manufactured at a reduced cost. The configuration of the redistribution layer 5B shown in FIG. 9 is merely illustrative and can be appropriately changed.

Fourth Modification of First Embodiment

Figure 10:
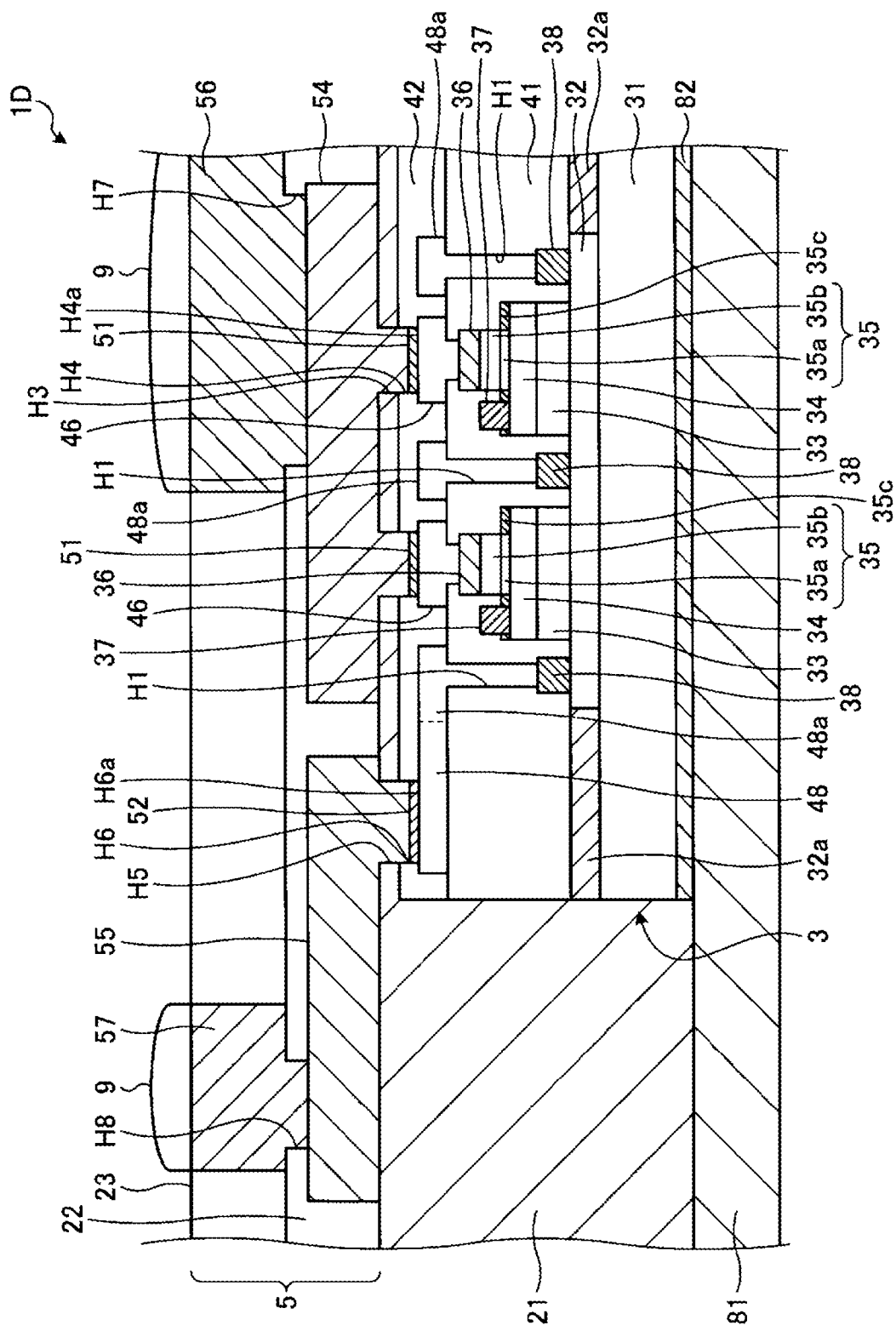
FIG. 10 is a sectional view schematically showing the cross-sectional configuration of a semiconductor device according to a fourth modification of the first embodiment.

FIG. 10 is a sectional view schematically showing the cross-sectional configuration of a semiconductor device according to a fourth modification of the first embodiment. As shown in FIG. 10, a semiconductor device 1D according to this modification includes first stress-relieving layers 51 disposed on the bottom surfaces H4a of the contact holes H3 and H4. The first emitter redistribution layer 54 is electrically connected to the emitter lines 46 through the first stress-relieving layers 51 disposed on the bottom surfaces H4a. The portion of the first emitter redistribution layer 54 under which the first stress-relieving layers 51 are not disposed is disposed on the first resin layer 21.

Similarly, a second stress-relieving layer 52 is disposed on the bottom surface H6a of the contact holes H5 and H6. The first collector redistribution layer 55 is electrically connected to the collector line 48 through the second stress-relieving layer 52 disposed on the bottom surface H6a. The portion of the first collector redistribution layer 55 under which the second stress-relieving layer 52 is not disposed is disposed on the first resin layer 21.

Since the first stress-relieving layers 51 are disposed in the regions where the first emitter redistribution layer 54 is connected to the emitter electrodes 36, the thermal stress acting on the emitter layers 35 can be effectively reduced. As in this modification, the thermal stress acting on the emitter layers 35 of the semiconductor device 1D can be reduced even if the first stress-relieving layers 51 overlap with portions of the first emitter redistribution layer 54.

Second Embodiment

Figure 11:
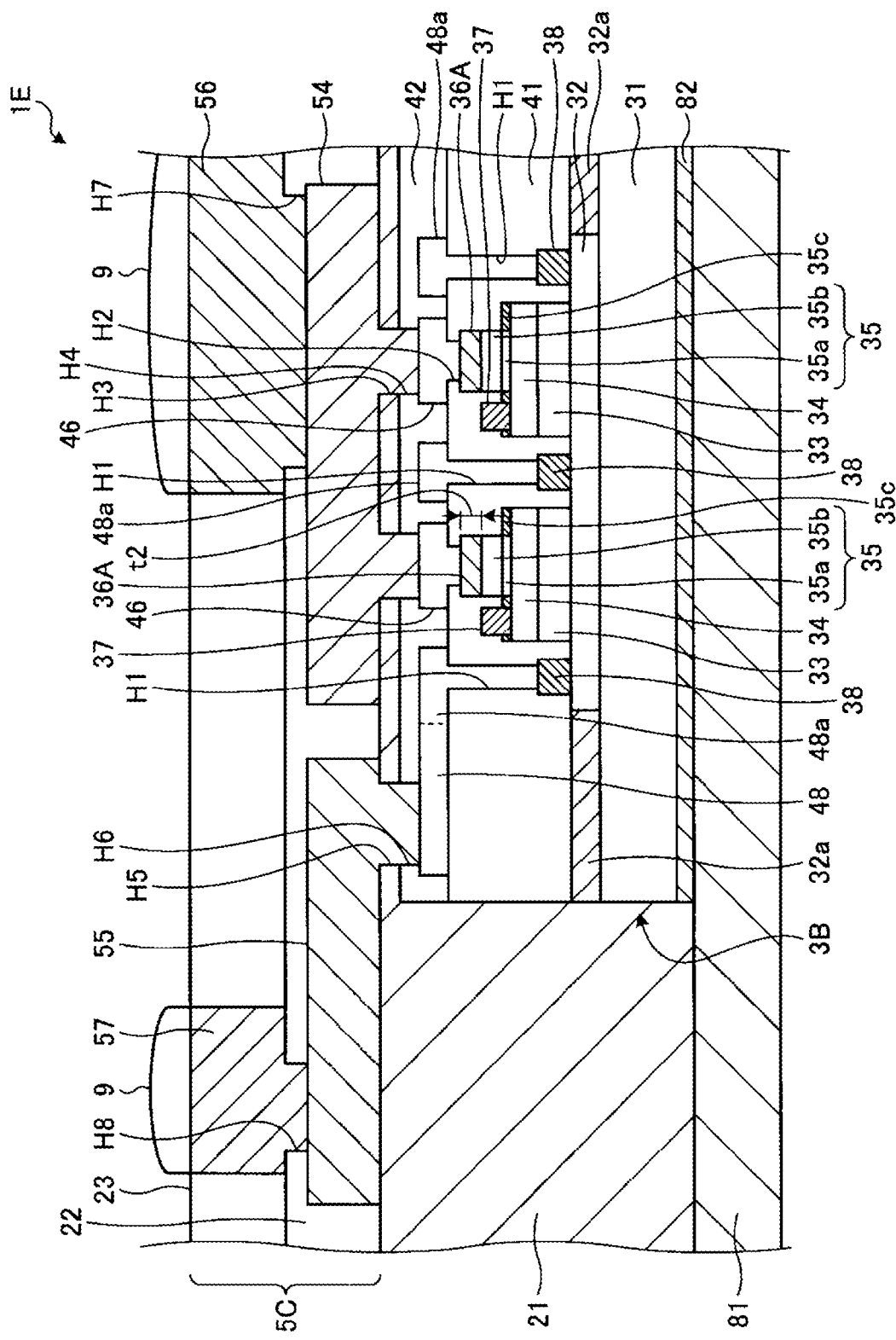
FIG. 11 is a sectional view schematically showing the cross-sectional configuration of a semiconductor device according to a second embodiment.
Figure 12:
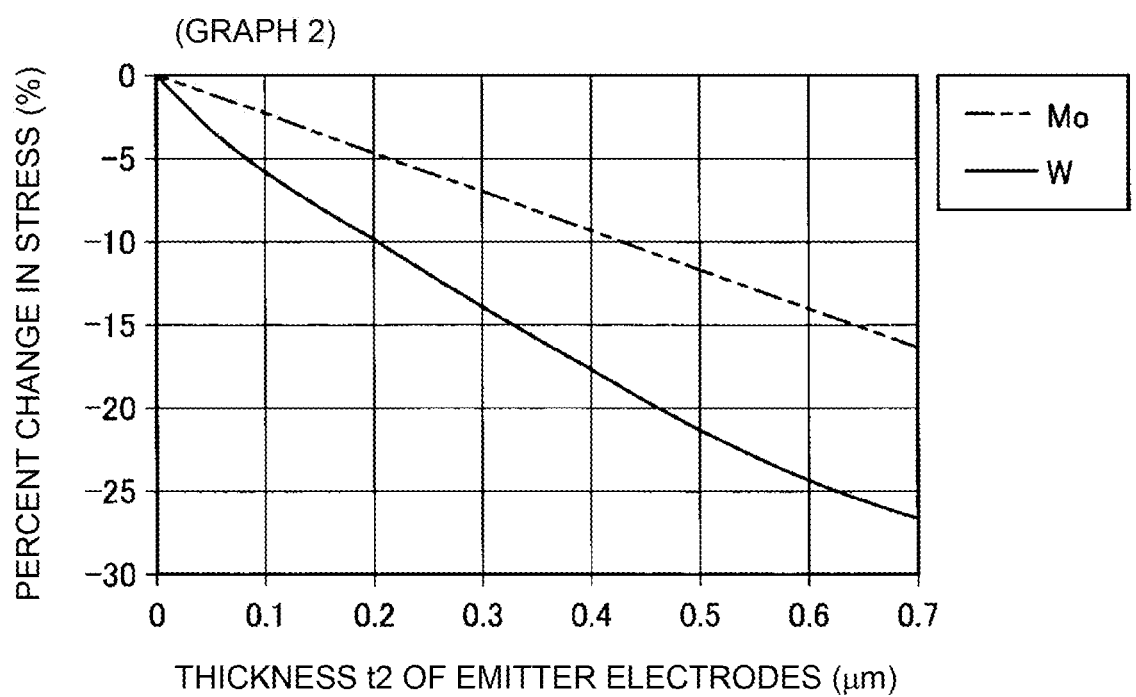
FIG. 12 is a graph showing the relationship between the thickness of emitter electrodes according to the second embodiment and the percent change in stress.

FIG. 11 is a sectional view schematically showing the cross-sectional configuration of a semiconductor device according to a second embodiment. FIG. 12 is a graph showing the relationship between the thickness of the emitter electrodes according to the second embodiment and the percent change in stress. As shown in FIG. 11, a semiconductor device 1E according to this embodiment includes a redistribution layer 5C that does not include the first stress-relieving layer 51 or the second stress-relieving layer 52 (see FIG. 4). That is, the first emitter redistribution layer 54 is disposed on the first resin layer 21 and is in direct contact with the emitter lines 46 via the contact holes H3 and H4. The first collector redistribution layer 55 is also disposed on the first resin layer 21 and is in direct contact with the collector line 48 via the contact holes H5 and H6.

A semiconductor element 3B includes emitter electrodes 36A formed of a high-melting-point metal or a compound or alloy thereof. The material used for the emitter electrodes 36A is similar to the material used for the first stress-relieving layer 51 described above, preferably W, Mo, or an alloy or compound containing W or Mo. The emitter electrodes 36A are disposed on the emitter layers 35. The emitter electrodes 36A are disposed between the first emitter redistribution layer 54 and the emitter layers 35 in the direction perpendicular to the surface of the compound semiconductor substrate 31. Thus, the emitter electrodes 36A can reduce the thermal stress acting on the emitter layers 35. Since the emitter electrodes 36A in this embodiment are disposed in contact with the emitter layers 35, the thermal stress acting on the emitter layers 35 can be effectively reduced.

Graph 2 in FIG. 12 shows the relationship between the thickness t2 (see FIG. 11) of the emitter electrodes 36A and the percent change in stress for each material used for the emitter electrodes 36A. The materials used for the emitter electrodes 36A are Mo and W. The percent change in stress in FIG. 12 shows the evaluation results obtained by the simulation. As the simulation conditions, the thickness t2 of the emitter electrodes 36A is shown in Graph 2, with the remaining conditions being identical to those of the first embodiment. The vertical axis in FIG. 12 indicates the change in the thermal stress, which is expressed as a relative quantity with respect to the thermal stress induced when the thickness t2 of the emitter electrodes 36A is zero, i.e., t2=0.

As shown in FIG. 12, whether Mo or W is used for the emitter electrodes 36A, the thermal stress acting on the emitter layers 35 decreases with increasing thickness t2 of the emitter electrodes 36A. If the thickness t2 of the emitter electrodes 36A is about 100 nm (0.1 µm) or more, the percent change in stress can be reduced by at least 2% or more. In particular, if W is used for the emitter electrodes 36A, the percent change in stress can be reduced by about 5% or more at thicknesses t1 of about 100 nm or more.

The use of W for the emitter electrodes 36A results in the gradient of the percent change in stress being larger than the use of Mo for the emitter electrodes 36A. The use of W for the emitter electrodes 36A allows for a larger reduction in the percent change in stress than the use of Mo for the emitter electrodes 36A. Thus, it is more preferred to use W for the emitter electrodes 36A. Although FIG. 12 illustrates an example where Mo or W is used for the emitter electrodes 36A, other materials may also be used as in the first embodiment, including compounds and alloys of Mo and W as well as Ti, Ta, Cr, and alloys and compounds of Ti, Ta, and Cr.

As described above, according to this embodiment, the thermal stress acting on the emitter layers 35 of the semiconductor device 1E can be reduced through the use of a high-melting-point metal or a compound or alloy thereof for the emitter electrodes 36A. The use of a high-melting-point metal or a compound or alloy thereof is not limited to the emitter electrodes 36A; the collector electrodes 38 and the base electrodes 37 may be formed of the same high-melting-point metal, compound, or alloy as the emitter electrodes 36A.

As a modification of this embodiment, the emitter electrodes 36A in FIG. 11 may be omitted, with the emitter lines 46 being in direct contact with the emitter layers 35. That is, the semiconductor device 1E may have a structure in which the emitter lines 46 function as emitter electrodes, which reduces the manufacturing cost. In this case, the same advantage as that of the second embodiment can be achieved if a high-melting-point metal as described above is used for the lower portions of the emitter lines 46 so that these portions function as stress-relieving layers.

Third Embodiment

Figure 13:
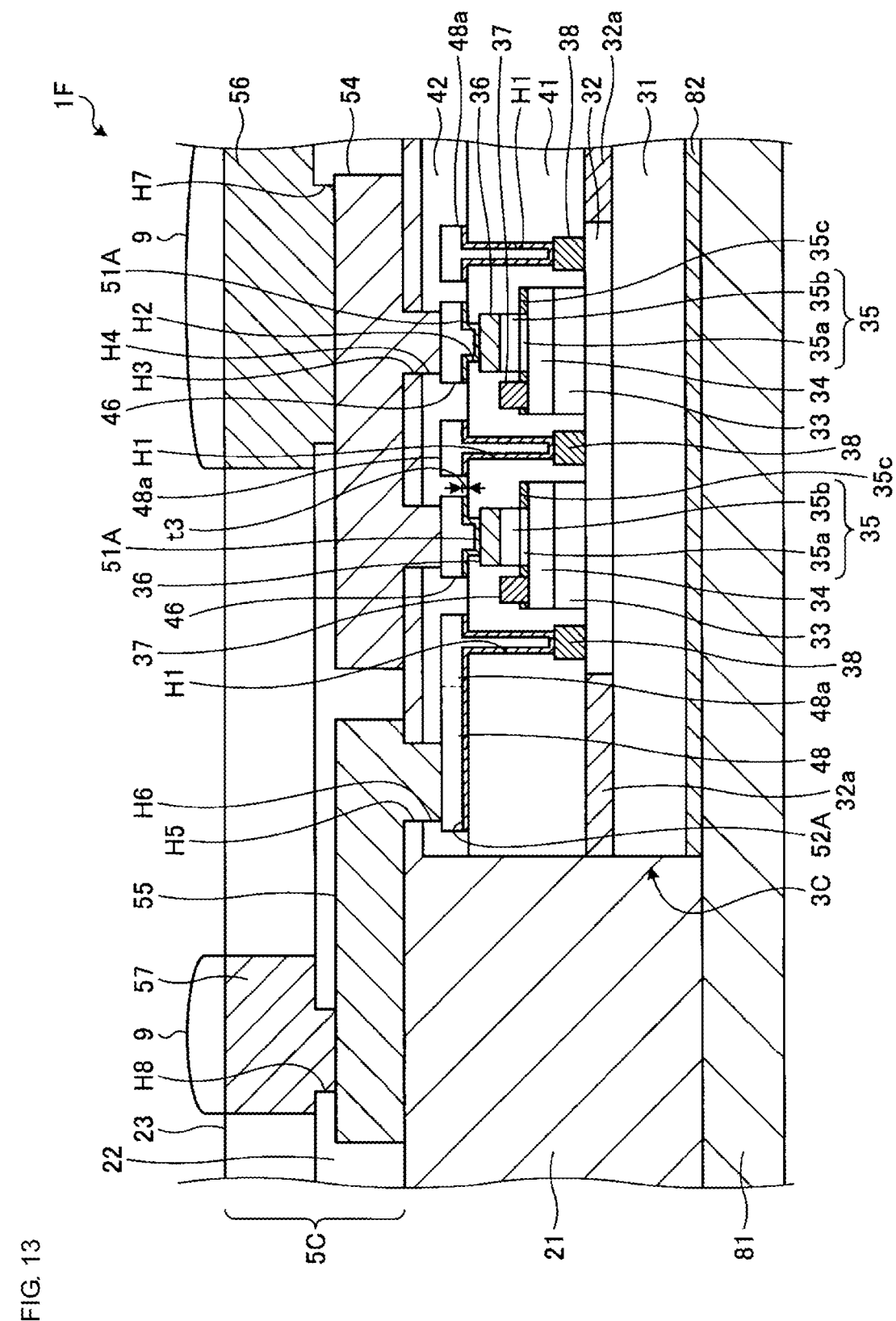
FIG. 13 is a sectional view schematically showing the cross-sectional configuration of a semiconductor device according to a third embodiment.
Figure 14:
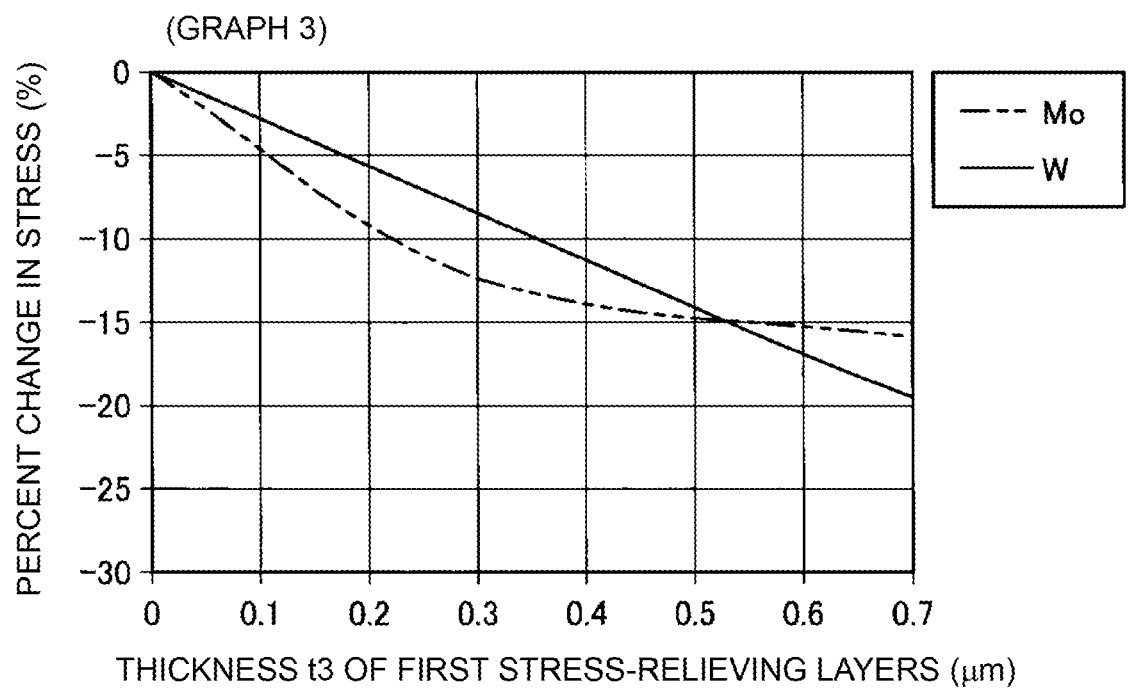
FIG. 14 is a graph showing the relationship between the thickness of first stress-relieving layers according to the third embodiment and the percent change in stress.

FIG. 13 is a sectional view schematically showing the cross-sectional configuration of a semiconductor device according to a third embodiment. FIG. 14 is a graph showing the relationship between the thickness of the first stress-relieving layers according to the third embodiment and the percent change in stress. A semiconductor device 1F according to this embodiment includes first stress-relieving layers 51A disposed under the emitter lines 46 of a semiconductor element 3C. The first stress-relieving layers 51A are disposed between the first insulating layer 41 and the emitter lines 46. The first stress-relieving layers 51A are disposed on the bottom and side surfaces of the contact holes H2 and in contact with the emitter electrodes 36. Thus, the emitter lines 46 are electrically connected to the emitter electrodes 36 through the first stress-relieving layers 51A.

A second stress-relieving layer 52A is disposed under the collector line 48 and the collector connection lines 48a of the semiconductor element 3C. The second stress-relieving layer 52A is disposed between the first insulating layer 41 and the collector line 48. The second stress-relieving layer 52A is also disposed between the first insulating layer 41 and the collector connection lines 48a. The second stress-relieving layer 52A is disposed on the bottom and side surfaces of the contact holes H1 and in contact with the collector electrodes 38. Thus, the collector line 48 is electrically connected to the collector electrodes 38 through the second stress-relieving layer 52A.

In this embodiment, the first stress-relieving layers 51A are disposed between the first emitter redistribution layer 54 and the emitter layers 35 in the direction perpendicular to the surface of the compound semiconductor substrate 31. Thus, the first stress-relieving layers 51A can reduce the thermal stress acting on the emitter layers 35.

Graph 3 in FIG. 14 shows the relationship between the thickness t3 (see FIG. 13) of the first stress-relieving layers 51A and the percent change in stress for each material used for the first stress-relieving layers 51A. The materials used for the first stress-relieving layers 51A are Mo and W. The percent change in stress in FIG. 14 shows the evaluation results obtained by the simulation. As the simulation conditions, the thickness t3 of the first stress-relieving layers 51A is shown in Graph 3, with the remaining conditions being identical to those of the first embodiment. The vertical axis in FIG. 14 indicates the change in the thermal stress, which is expressed as a relative quantity with respect to the thermal stress induced when the thickness t3 of the first stress-relieving layers 51A is zero, i.e., t3=0.

As shown in FIG. 14, whether Mo or W is used for the first stress-relieving layers 51A, the thermal stress acting on the emitter layers 35 decreases with increasing thickness t3 of the first stress-relieving layers 51A. If the thickness t3 of the first stress-relieving layers 51A is about 100 nm (0.1 μm) or more, the percent change in stress decreases by at least 2% or more. At a thickness t3 of about 100 nm, the use of Mo for the first stress-relieving layers 51A results in a larger reduction in the percent change in stress than the use of W for the first stress-relieving layers 51A.

At thicknesses t3 of less than about 530 nm, the use of Mo for the first stress-relieving layers 51A results in a lower percent change in stress than the use of W for the first stress-relieving layers 51A. At thicknesses t3 of about 530 nm or more, the use of W for the first stress-relieving layers 51A results in a lower percent change in stress than the use of Mo for the first stress-relieving layers 51A. If W is used for the first stress-relieving layers 51A, the gradient of the percent change in stress remains constant at thicknesses t3 of about 300 nm or more. It is more preferred to use Mo if thin first stress-relieving layers 51A are formed. It is more preferred to use W if thick first stress-relieving layers 51A are formed. Although FIG. 14 illustrates an example where Mo or W is used for the first stress-relieving layers 51A, other materials may also be used as in the first embodiment, including compounds and alloys of Mo and W as well as Ti, Ta, Cr, and alloys and compounds of Ti, Ta, and Cr.

As described above, according to this embodiment, the thermal stress acting on the emitter layers 35 of the semiconductor device 1F can be reduced through the use of a high-melting-point metal or a compound or alloy thereof for the first stress-relieving layers 51A. The second stress-relieving layer 52A may be formed of the same high-melting-point metal, compound, or alloy as the first stress-relieving layers 51A. The first stress-relieving layers 51A and the second stress-relieving layer 52A can be formed in the same step as the emitter lines 46 and the collector line 48. Thus, the semiconductor element 3C of the semiconductor device 1F can be manufactured at a reduced cost.

Modification of Third Embodiment

Figure 15:
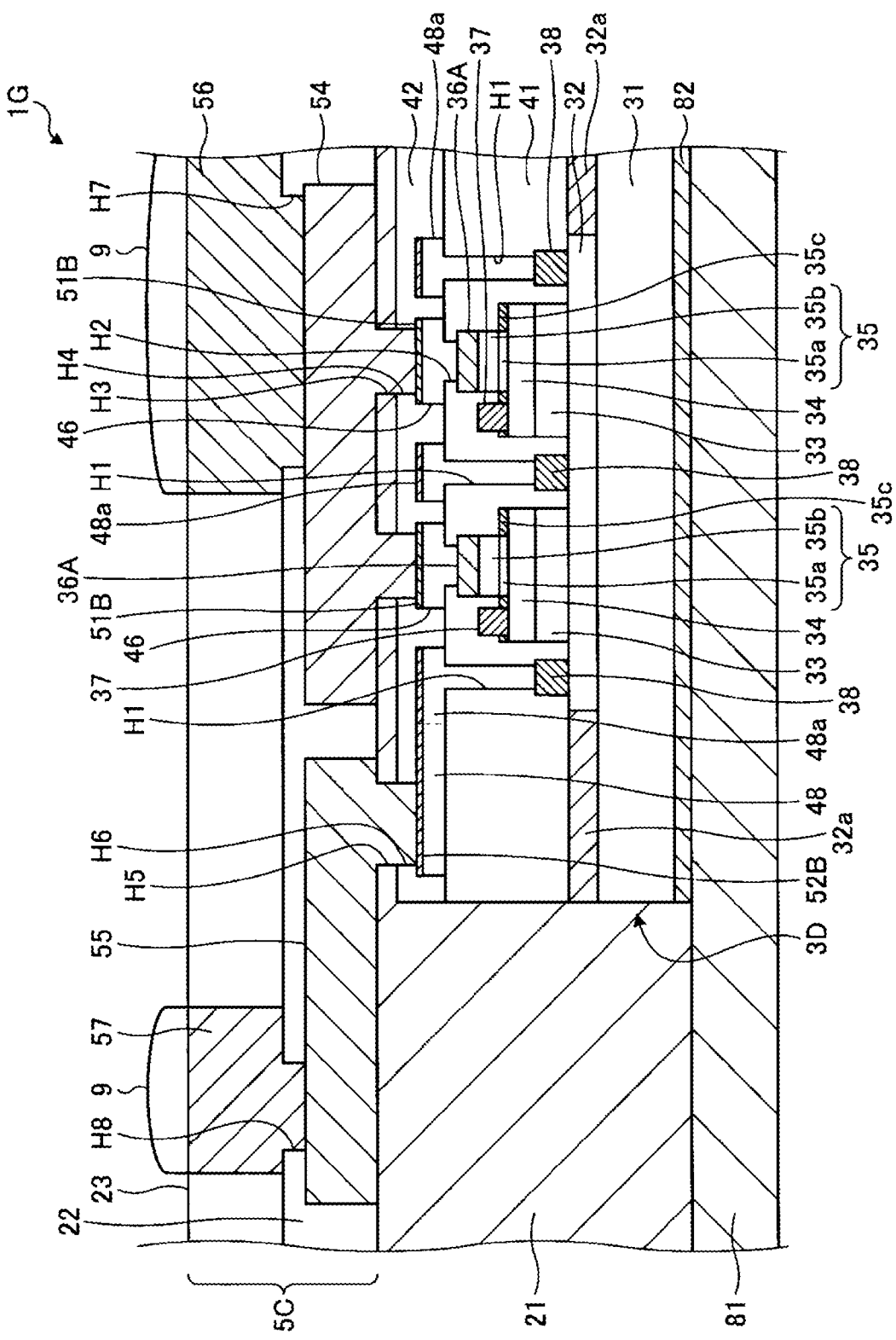
FIG. 15 is a sectional view schematically showing the cross-sectional configuration of a semiconductor device according to a modification of the third embodiment.

FIG. 15 is a sectional view schematically showing the cross-sectional configuration of a semiconductor device according to a modification of the third embodiment. A semiconductor device 1G according to this modification includes first stress-relieving layers 51B disposed over the emitter lines 46 of a semiconductor element 3D. The first stress-relieving layers 51B are disposed between the emitter lines 46 and the second insulating layer 42. The first stress-relieving layers 51B are exposed at the bottom surfaces of the contact holes H3 and H4 and are connected to the first emitter redistribution layer 54.

A second stress-relieving layer 52B is disposed over the collector line 48 and the collector connection lines 48a of the semiconductor element 3D. The second stress-relieving layer 52B is disposed between the second insulating layer 42 and the collector line 48. The second stress-relieving layer 52B is also disposed between the second insulating layer 42 and the collector connection lines 48a. The second stress-relieving layer 52B is exposed at the bottom surface of the contact holes H5 and H6 and is connected to the first collector redistribution layer 55.

In this modification, the first stress-relieving layers 51B are disposed between the first emitter redistribution layer 54 and the emitter layers 35 in the direction perpendicular to the surface of the compound semiconductor substrate 31. The material used for the first stress-relieving layers 51B may be, for example, a high-melting-point material as described above. Thus, as in the case of FIGS. 13 and 14, the first stress-relieving layers 51B can reduce the thermal stress acting on the emitter layers 35.

Fourth Embodiment

Figure 16:
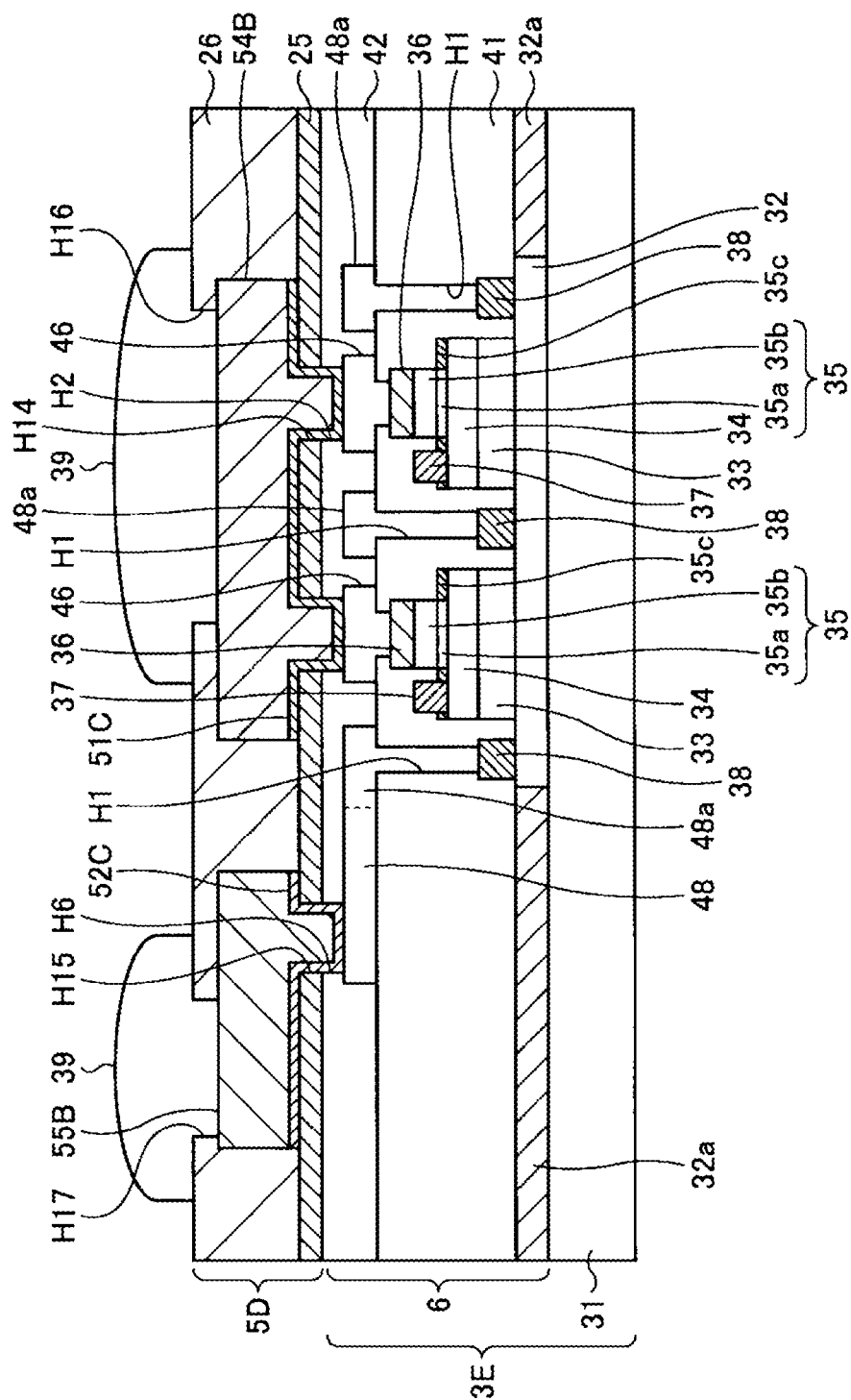
FIG. 16 is a sectional view schematically showing the cross-sectional configuration of a semiconductor element according to a fourth embodiment.
Figure 17:
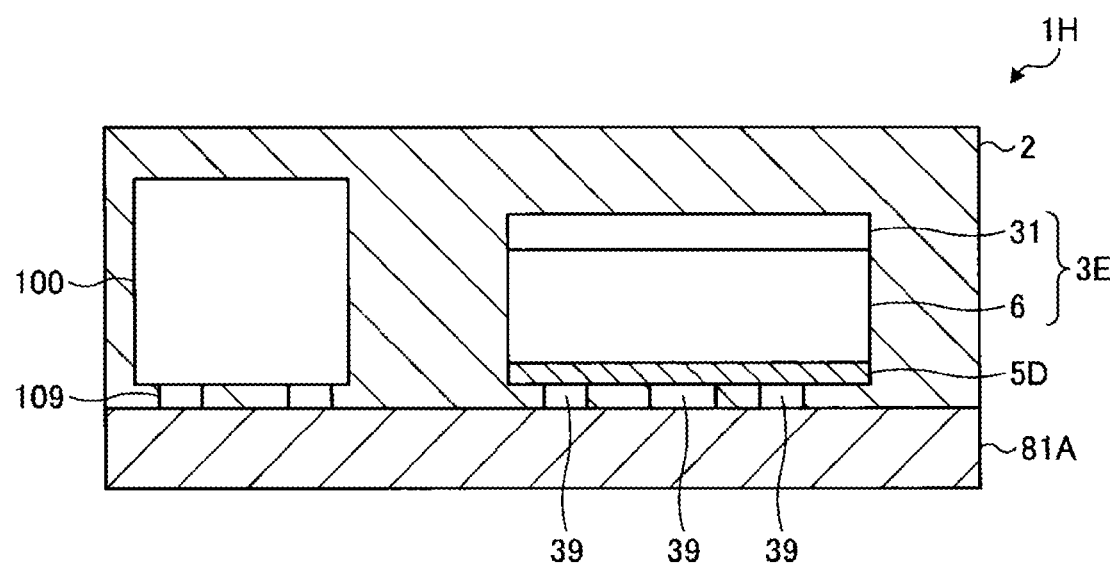
FIG. 17 is a sectional view schematically showing the cross-sectional configuration of a semiconductor device according to the fourth embodiment.

FIG. 16 is a sectional view schematically showing the cross-sectional configuration of a semiconductor element according to a fourth embodiment. FIG. 17 is a sectional view schematically showing the cross-sectional configuration of a semiconductor device according to the fourth embodiment. As shown in FIG. 16, a semiconductor element 3E, as in the first embodiment, includes a compound semiconductor substrate 31 and a semiconductor layer 6. The semiconductor layer 6 includes layers such as the subcollector layer 32, the collector layers 33, the base layers 34, and the emitter layers 35. A redistribution layer 5D is disposed on the second insulating layer 42.

The redistribution layer 5D includes a first emitter redistribution layer 54B, a first collector redistribution layer 55B, a first stress-relieving layer 51C, a second stress-relieving layer 52C, a fifth resin layer 25, and a sixth resin layer 26. The fifth resin layer 25 and the sixth resin layer 26 are stacked in that order on the second insulating layer 42. The first stress-relieving layer 51C and the first emitter redistribution layer 54B are stacked on the fifth resin layer 25.

The first stress-relieving layer 51C is disposed under and in contact with the first emitter redistribution layer 54B. The first stress-relieving layer 51C is disposed on the bottom and side surfaces of the contact holes H2 in the second insulating layer 42 and contact holes H14 in the fifth resin layer 25. Thus, the first stress-relieving layer 51C and the first emitter redistribution layer 54B are electrically connected to the emitter lines 46. As a result, the emitter electrodes 36 are electrically connected to the common first emitter redistribution layer 54B.

The second stress-relieving layer 52C and the first collector redistribution layer 55B are also stacked on the fifth resin layer 25. The second stress-relieving layer 52C is disposed under and in contact with the first collector redistribution layer 55B. The second stress-relieving layer 52C is disposed on the bottom and side surfaces of the contact hole H6 in the second insulating layer 42 and a contact hole H15 in the fifth resin layer 25. Thus, the second stress-relieving layer 52C and the first collector redistribution layer 55B are electrically connected to the collector line 48. As a result, the collector electrodes 38 are electrically connected to the common first collector redistribution layer 55B.

The sixth resin layer 26 is disposed over the fifth resin layer 25 and covers the first emitter redistribution layer 54B and the first collector redistribution layer 55B. The first emitter redistribution layer 54B is connected to a bump 39 via a contact hole H16. The first collector redistribution layer 55B is connected to a bump 39 via a contact hole H17. The bumps 39 are terminals for the mounting of the semiconductor element 3E.

Large numbers of semiconductor elements 3E and redistribution layers 5D are formed on one compound semiconductor substrate 31 (wafer). The semiconductor elements 3E and the redistribution layers 5D are singulated by a technique such as dicing and are mounted as semiconductor chips on support substrates 81A (see FIG. 17).

As shown in FIG. 17, a semiconductor device 1H includes a support substrate 81A, a semiconductor element 3E, and a surface mount device 100. The support substrate 81A may be, for example, a resin substrate having multiple wiring layers. The singulated semiconductor element 3E is mounted on the support substrate 81A with the redistribution layer 5D and the bumps 39 interposed therebetween. In this embodiment, the semiconductor element 3E is mounted such that the components are arranged in the following order: the support substrate 81A, the redistribution layer 5D, the semiconductor layer 6, and the compound semiconductor substrate 31. The surface mount device 100 is also mounted on the support substrate 81A with bumps 109 interposed therebetween. A resin layer 2 covers the semiconductor element 3E and the surface mount device 100.

The semiconductor element 3E has the redistribution layer 5D and the bumps 39 formed on the same wafer. Thus, the semiconductor element 3E of the semiconductor device 1H can be easily mounted by a technique in the related art, such as flip chip mounting.

The foregoing embodiments are presented for a better understanding of the present disclosure and should not be construed as limiting the scope of the invention. Modifications and improvements can be made without departing from the spirit of the invention, and equivalents are also included within the scope of the invention.

The semiconductor devices 1 and 1A to 1H may have the following aspects.

(1) A semiconductor device according to one aspect of the present disclosure includes a semiconductor element including a bipolar transistor disposed on a compound semiconductor substrate, a collector electrode, a base electrode, and an emitter electrode, the bipolar transistor including a collector layer, a base layer, and an emitter layer, the collector electrode being in contact with the collector layer, the base electrode being in contact with the base layer, the emitter electrode being in contact with the emitter layer; a protective layer (first resin layer 21) disposed on one surface of the semiconductor element; an emitter redistribution layer electrically connected to the emitter electrode via a contact hole in the protective layer; and a stress-relieving layer disposed between the emitter redistribution layer and the emitter layer in a direction perpendicular to a surface of the compound semiconductor substrate.

According to Item (1), the stress-relieving layer can reduce the thermal stress resulting from the difference in thermal expansion coefficient between the emitter redistribution layer and the emitter layer. This reduces the likelihood of damage to the emitter layer due to the thermal stress and thus prevents the current amplification factor of the bipolar transistor from dropping within a short period of time. Thus, the semiconductor device including the bipolar transistor exhibits improved reliability.

(2) In Item (1) above, the emitter layer may include a plurality of emitter layers, the emitter electrode may include a plurality of emitter electrodes disposed on the respective emitter layers, and the emitter layers may be electrically connected to the common emitter redistribution layer.

According to Item (2), the emitter redistribution layer is disposed over one surface of the semiconductor element. This eliminates the need to provide a wiring line for connecting the emitter layers inside the semiconductor element. Emitter lines, which are formed of, for example, Au, need not be provided in two or more layers in the semiconductor element. Thus, the semiconductor element can be manufactured at a reduced cost.

(3) In Item (1) or (2) above, at least a portion of the emitter layer may overlap with the emitter redistribution layer in a plan view.

According to Item (3), the emitter redistribution layer effectively dissipates the heat generated by the bipolar transistor, thus reducing the temperature rise of the bipolar transistor, particularly when the semiconductor device is used in power transistor applications. As a result, the semiconductor device exhibits less decrease in bipolar transistor performance and therefore improved radio-frequency characteristics.

(4) In any one of Items (1) to (3) above, the stress-relieving layer may include at least one metal selected from the group consisting of tungsten, molybdenum, tantalum, titanium, and chromium, or may include a compound containing the at least one metal, or may include an alloy containing the at least one metal.

According to Item (4), the use of the high-melting-point material as described above for the stress-relieving layer effectively reduces the thermal stress acting on the emitter layer of the semiconductor device.

(5) In any one of Items (1) to (4) above, the stress-relieving layer may have a thickness of about 100 nm or more.

According to Item (5), the use of a stress-relieving layer having a thickness of about 100 nm or more effectively reduces the thermal stress acting on the emitter layer of the semiconductor device.

(6) In Item (2) above, the semiconductor element may further include a plurality of emitter lines disposed on the respective emitter electrodes and separated from each other, and the emitter layers may be electrically connected to the emitter redistribution layer through the respective emitter lines.

According to Item (6), the emitter lines included in the semiconductor element are disposed on the respective emitter electrodes. This eliminates the need to provide the emitter, collector, and base lines in multiple layers inside the semiconductor element. Thus, the semiconductor element of the semiconductor device can be manufactured at a reduced cost.

(7) In any one of Items (1) to (5) above, the stress-relieving layer may be disposed between the emitter redistribution layer and the protective layer in the direction perpendicular to the surface of the compound semiconductor substrate.

According to Item (7), the stress-relieving layer can reduce the thermal stress acting on the emitter layer. In addition, the stress-relieving layer is disposed at a position away from the emitter layer, and even if Cu is used for the redistribution layer, less Cu diffuses into the emitter layer.

(8) In Item (7) above, the stress-relieving layer may be disposed in a region overlapping at least a bottom surface of the contact hole.

According to Item (8), the stress-relieving layer is disposed in the region where the redistribution layer is connected to the emitter electrode, thus reducing the thermal stress acting on the emitter layer.

(9) In Item (7) or (8) above, the stress-relieving layer may be in direct contact with the emitter electrode at a bottom surface of the contact hole.

According to Item (9), the semiconductor element includes no wiring line for connection to, for example, the emitter electrode. Thus, the semiconductor element of the semiconductor device can be manufactured at a reduced cost.

(10) In any one of Items (1) to (5) above, the stress-relieving layer may be the emitter electrode.

According to Item (10), the emitter electrode is disposed in contact with the emitter layer, thus effectively reducing the thermal stress acting on the emitter layer.

(11) In any one of Items (1) to (5) above, the semiconductor element may further include a first insulating layer covering the collector electrode, the base electrode, and the emitter electrode; and an emitter line disposed on the first insulating layer and in contact with the emitter electrode, and the stress-relieving layer may be disposed on the emitter line.

According to Item (11), the stress-relieving layer can be formed in the same step as the emitter line. Thus, the semiconductor element of the semiconductor device can be manufactured at a reduced cost.

(12) The semiconductor device according to any one of Items (1) to (11) above may further include a support substrate and a bump connected to the emitter redistribution layer. The semiconductor element may be connected to the support substrate through the bump.

According to Item (12), the semiconductor element can be easily mounted on the support substrate by a mounting technique in the related art.

While preferred embodiments of the disclosure have been described above, it is to be understood that variations and modifications will be apparent to those skilled in the art without departing from the scope and spirit of the invention. The scope of the invention, therefore, is to be determined solely by the following claims.

What is claimed is:

1. A semiconductor device comprising:
   a semiconductor element including a bipolar transistor disposed on a compound semiconductor substrate, a collector electrode, a base electrode, and at least one emitter electrode, the bipolar transistor including a collector layer, a base layer, and at least one emitter layer, the collector electrode being in contact with the collector layer, the base electrode being in contact with the base layer, the at least one emitter electrode being in contact with the at least one emitter layer;
   a protective layer disposed on one surface of the semiconductor element;
   an emitter redistribution layer electrically connected to the at least one emitter electrode via a contact hole in the protective layer; and
   a stress-relieving layer disposed between the emitter redistribution layer and the at least one emitter layer in a direction perpendicular to a surface of the compound semiconductor substrate.

2. The semiconductor device according to claim 1, wherein
   the at least one emitter layer comprises a plurality of emitter layers,
   the at least one emitter electrode comprises a plurality of emitter electrodes disposed on respective ones of the plurality of emitter layers, and
   the plurality of emitter layers are electrically connected to a common one of the emitter redistribution layer.

3. The semiconductor device according to claim 2, wherein
   the semiconductor element further includes a plurality of emitter lines disposed on respective ones of the plurality of emitter electrodes and separated from each other, and
   the plurality of emitter layers are electrically connected to the emitter redistribution layer through respective ones of the plurality of emitter lines.

4. The semiconductor device according to claim 2, wherein at least a portion of the at least one emitter layer overlaps with the emitter redistribution layer in a plan view.

5. The semiconductor device according to claim 2, wherein the stress-relieving layer comprises at least one metal selected from the group consisting of tungsten, molybdenum, tantalum, titanium, and chromium, or comprises a compound containing the at least one metal, or comprises an alloy containing the at least one metal.

6. The semiconductor device according to claim 2, wherein the stress-relieving layer has a thickness of about 100 nm or more.

7. The semiconductor device according to claim 2, wherein the stress-relieving layer is disposed between the emitter redistribution layer and the protective layer in the direction perpendicular to the surface of the compound semiconductor substrate.

8. The semiconductor device according to claim 1, wherein at least a portion of the at least one emitter layer overlaps with the emitter redistribution layer in a plan view.

9. The semiconductor device according to claim 8, wherein the stress-relieving layer comprises at least one metal selected from the group consisting of tungsten, molybdenum, tantalum, titanium, and chromium, or comprises a compound containing the at least one metal, or comprises an alloy containing the at least one metal.

10. The semiconductor device according to claim 8, wherein the stress-relieving layer has a thickness of about 100 nm or more.

11. The semiconductor device according to claim 8, wherein the stress-relieving layer is disposed between the emitter redistribution layer and the protective layer in the direction perpendicular to the surface of the compound semiconductor substrate.

12. The semiconductor device according to claim 1, wherein the stress-relieving layer comprises at least one metal selected from the group consisting of tungsten, molybdenum, tantalum, titanium, and chromium, or comprises a compound containing the at least one metal, or comprises an alloy containing the at least one metal.

13. The semiconductor device according to claim 12, wherein the stress-relieving layer has a thickness of about 100 nm or more.

14. The semiconductor device according to claim 1, wherein the stress-relieving layer has a thickness of about 100 nm or more.

15. The semiconductor device according to claim 1, wherein the stress-relieving layer is disposed between the emitter redistribution layer and the protective layer in the direction perpendicular to the surface of the compound semiconductor substrate.

16. The semiconductor device according to claim 15, wherein the stress-relieving layer is disposed in a region overlapping with at least a bottom surface of the contact hole.

17. The semiconductor device according to claim 15, wherein the stress-relieving layer is in direct contact with the at least one emitter electrode at a bottom surface of the contact hole.

18. The semiconductor device according to claim 1, wherein the stress-relieving layer comprises the at least one emitter electrode.

19. The semiconductor device according to claim 1, wherein the semiconductor element further includes:
   a first insulating layer covering the collector electrode, the base electrode, and at least one the emitter electrode; and
   an emitter line disposed on the first insulating layer and in contact with the at least one emitter electrode,
   the stress-relieving layer being disposed on the emitter line.

20. The semiconductor device according to claim 1, further comprising:
   a support substrate; and
   a bump connected to the emitter redistribution layer,
   the semiconductor element being connected to the support substrate through the bump.

* * * * *